(12) United States Patent
Chen et al.

(10) Patent No.: US 9,269,675 B2
(45) Date of Patent: Feb. 23, 2016

(54) SEMICONDUCTOR DEVICE AND MANUFACTURING METHOD THEREOF

(71) Applicant: TAIWAN SEMICONDUCTOR MANUFACTURING COMPANY LTD., HSINCHU (TW)

(72) Inventors: Ying-Ju Chen, Yunlin County (TW); Hsien-Wei Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 98 days.

(21) Appl. No.: 14/057,422

(22) Filed: Oct. 18, 2013

(65) Prior Publication Data

US 2015/0108641 A1 Apr. 23, 2015

(51) Int. Cl.
| | |
|---|---|
| H01L 21/46 | (2006.01) |
| H01L 23/00 | (2006.01) |
| H01L 21/78 | (2006.01) |
| H01L 23/31 | (2006.01) |
| H01L 21/56 | (2006.01) |

(52) U.S. Cl.
CPC .............. *H01L 23/562* (2013.01); *H01L 21/78* (2013.01); *H01L 23/3114* (2013.01); *H01L 24/11* (2013.01); *H01L 24/14* (2013.01); *H01L 21/561* (2013.01); *H01L 2224/119* (2013.01); *H01L 2924/014* (2013.01); *H01L 2924/181* (2013.01)

(58) Field of Classification Search
CPC ................. H01L 2924/00; H01L 2924/00014; H01L 24/11; H01L 2224/32225; H01L 2224/97
USPC .................................. 438/113, 114, 460, 462
See application file for complete search history.

(56) References Cited

U.S. PATENT DOCUMENTS

| | | | |
|---|---|---|---|
| 7,556,985 B2* | 7/2009 | Fukasawa et al. | 438/113 |
| 2009/0298234 A1* | 12/2009 | Lee et al. | 438/114 |
| 2012/0329250 A1* | 12/2012 | Oda et al. | 438/465 |

* cited by examiner

*Primary Examiner* — Andy Huynh
(74) *Attorney, Agent, or Firm* — WPAT, P.C.; Anthony King

(57) ABSTRACT

A method of manufacturing a semiconductor device includes providing a carrier including a first layer, a second layer, a first surface of the first layer and a second surface of the second layer, disposing a plurality of solder bumps on the second surface, disposing a molding between the plurality of solder bumps and over the second surface, cutting the first layer to form a first recess in the first layer, wherein the first recess is above a position between at least two of the plurality of solder bumps, and cutting the molding from a bottom surface of the first recess to form a second recess in the molding between the at least two of the plurality of solder bumps. Further, a semiconductor device includes a carrier including a first layer and a second layer, a plurality of solder bumps disposed on the second layer, a molding disposed over the second layer and surrounding the plurality of solder bumps, the molding includes a protruded portion protruding from a sidewall of the first layer adjacent to an end portion of the first layer.

20 Claims, 33 Drawing Sheets

SEMICONDUCTOR DEVICE AND MANUFACTURING METHOD THEREOF

FIELD

The disclosure relates to a semiconductor device and a method of manufacturing a semiconductor device.

BACKGROUND

Electronic equipments involving semiconductor devices are indispensable from our daily life. With the advancement of electronic technology, electronic equipments become smaller in size and complicated in structures and functionality. A wafer level packaging (WLP) technology has been gaining in popularity and is widely applied. This technology provides a wafer level manufacturing of the semiconductor devices with high functions and complicated structures while the size of the semiconductor devices is minimized.

The WLP technology is widely adopted for assembling and combining a number of semiconductor components to become a semiconductor device so as to minimize the final size of the semiconductor device as well as the electronic equipment. During the operations of assembling the semiconductor device, the semiconductor device is sawed and singulated from a carrier by a mechanical or laser blade. The semiconductor device is individualized for subsequent assembling operations. However, the semiconductor device includes many semiconductor components with complicated structure. The singulation operations involve many complicated manufacturing processes. The semiconductor device is easily damaged during the singulation operations.

The sawing operations on such a small and dense area of the semiconductor device is complicated, because it involves numerous of operations and those operations are applied on the small semiconductor device including many different kinds of materials with different properties. The difference on materials would increase a complexity of the manufacturing and yield loss of the semiconductor device, such as poor bondability between components, poor reliability of the molding, cracking or delamination of the components or carrier.

As such, there is a continuous need to improve the sawing operations and the method for manufacturing the semiconductor device and solve the above deficiencies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
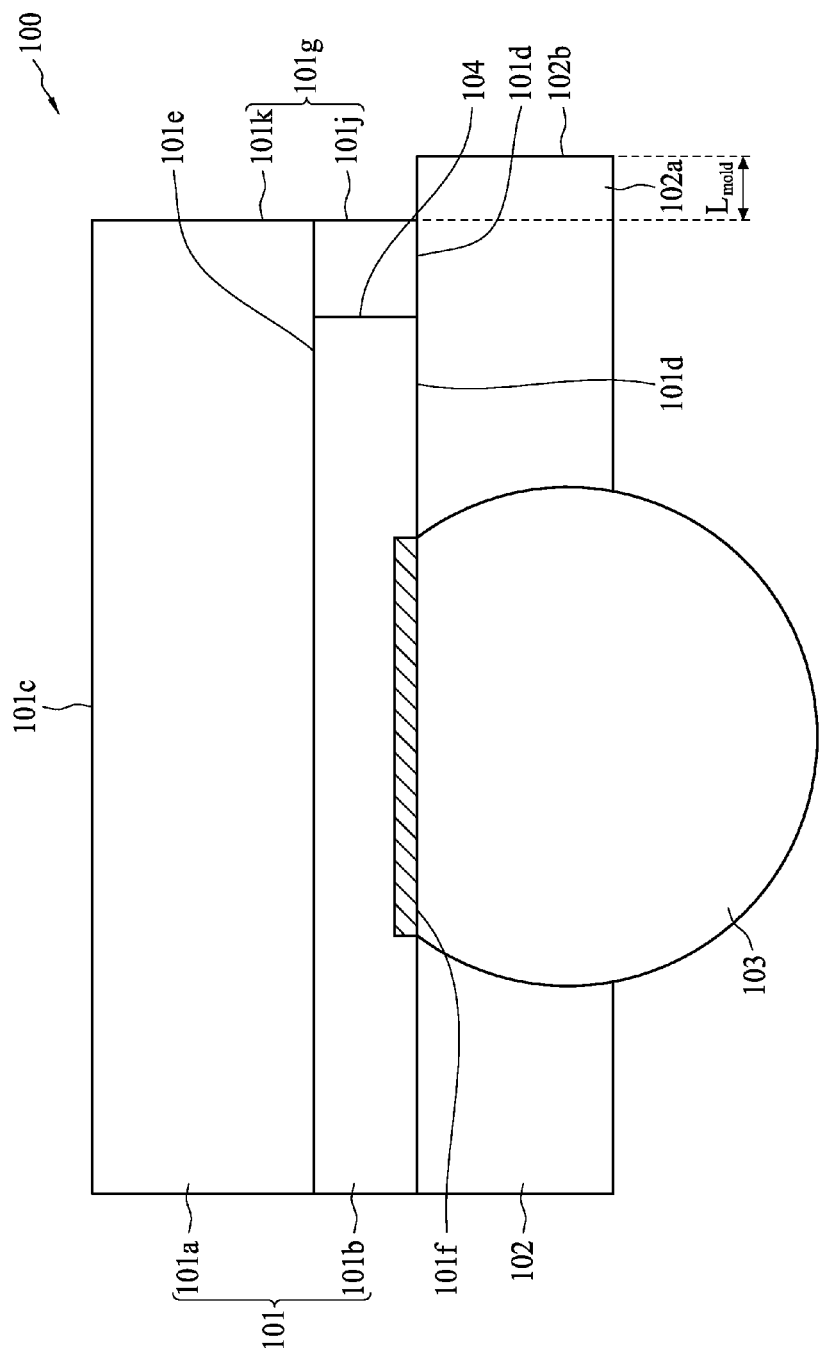
FIG. 1 is a schematic view of a semiconductor device in accordance with some embodiments of the present disclosure.

A semiconductor device is manufactured by a number of operations. During the manufacturing, the wafer is sawed to singulate out several chips or dies. The wafer is sawed in accordance with several predetermined scribing lines in order to individualize several dies from the wafer. Upon singulation, the wafer is sawed by several steps of cutting. Each step of cutting would cut through at least one layer of the wafer. Among the steps of cutting, a molding compound layer of the wafer is first cut by a mechanical saw or the like, a silicon substrate layer of the wafer is then cut by another mechanical saw which has smaller width than the mechanical saw.

However, some small chips or fragments of the molding compound are produced during cutting of the molding compound. Those small chips peeled out from the molding compound during the cutting would temporarily attach on the mechanical saw and dispose on sidewalls of a cut, and thus the small chips would affect the quality of the cutting of the molding material as well as the silicon substrate layer. The small chips disposed on the sidewalls of the cut would cause damage on the silicon substrate layer upon cutting the silicon substrate layer.

Therefore, cracks are found in the silicon substrate layer. The cracks would induce a high stress within the silicon substrate. The crack can even propagate through the silicon substrate during subsequent sawing operations to further weaken the silicon substrate as well as electrical connections between layers, and ultimately result in a failure of the semiconductor device.

The manufacturing and use of the embodiments of the present disclosure are discussed in details below. It should be appreciated, however, that the embodiments provide many applicable inventive concepts that can be embodied in a wide variety of specific contexts. It is to be understood that the following disclosure provides many different embodiments or examples for implementing different features of various embodiments. Specific examples of components and arrangements are described below to simplify the present disclosure. These are, of course, merely examples and are not intended to be limiting.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Further, it is understood that several processing steps and/or features of a device may be only briefly described. Also, additional processing steps and/or features can be added, and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

In the present disclosure, a semiconductor device with an improved configuration is disclosed. The semiconductor device includes a stepped sidewall adjacent to an end portion of the semiconductor device. The semiconductor device is flipped over such that a substrate layer of the semiconductor device is faced upward while several solder bumps are faced downward. The substrate layer is first sawed by a blade, a molding of the semiconductor device is then sawed by another blade. As the molding is sawed after sawing the substrate layer, chips peeled out from the molding during the sawing of the molding would not affect the sawing of the substrate layer, and thus the chips of the molding would not damage the substrate layer and would not cause cracking or delamination of the substrate layer. As a result, a reliability of the semiconductor device is improved.

FIG. 1 is an embodiment of a semiconductor device 100. The semiconductor device 100 includes a carrier 101. In some embodiments, the carrier 101 is a silicon wafer which would be fabricated to become integrated circuits (IC) in subsequent manufacturing operations. In some embodiments, the carrier 101 is a circuit board including some circuits for electrical connection of components thereon. In some embodiments, the circuit board is a printed circuit board (PCB). In some embodiments, the carrier 101 is in a circular shape.

In some embodiments, the carrier 101 includes several different layers in different materials. In some embodiments, the carrier 101 includes a first layer 101a and a second layer 101b. In some embodiments, the first layer 101a is a substrate layer which includes some electrical interconnections within the substrate layer and supports several semiconductor components on the substrate layer. In some embodiments, a die is supported on the substrate layer and is connected with a circuitry internal to the substrate layer. In some embodiments, the first surface 101c is a top surface of the carrier 101. The first surface 101c is horizontally disposed on top of the carrier 101. In some embodiments, the first layer 101a includes silicon, aluminum or etc.

In some embodiments, the second layer 101b of the carrier 101 is disposed below and along the first layer 101a. The second layer 101b is extended parallel to the first layer 101a. In some embodiments, the second layer 101b is bonded with the first layer 101a. There is an interface 101e between the first layer 101a and the second layer 101b. The interface 101e is configured for bonding the first layer 101a over the second layer 101b. In some embodiments, the second layer 101b includes a conductive material for electrically connecting the die, the circuitry within the first layer 101a and the circuitry within the second layer 101b. In some embodiments, the second layer 101b includes metals such as gold, silver, copper, nickel, tungsten, aluminum, and/or alloys thereof.

In some embodiments, the second layer 101b includes a redistribution layer (RDL). The RDL is an electrical connection to and/or between the die and the circuitry external to the die. The RDL re-routes a path of a circuit from the RDL layer to the circuitry of the die. In some embodiments, the second layer 101b includes an intermetal dielectric (IMD) layer. The IMD layer is an insulation layer to electrically isolate those electrical interconnections within the carrier 101.

In some embodiments, the second surface 101d is a bottom surface of the carrier 101 opposite to the top surface 101c of the carrier 101. In some embodiments, the second surface 101d is horizontally disposed at the bottom of the carrier 101. In some embodiments, the second surface 101d is parallel to the first surface 101c.

In some embodiments, a solder bump 103 is disposed on the second surface 101d. In some embodiments, the solder bump 103 is disposed by ball drop, stencil, pasting, electroplating or etc. In some embodiments, the solder bump 103 is configured for electrically connecting with a pad disposed on another carrier. In some embodiments, the solder bump 103 is made of a solder material including copper, aluminum, zinc, gold, lead or etc. In some embodiments, the solder bump 103 is in a spherical shape as a solder ball.

In some embodiments, the second layer 101b includes a pad 101f disposed on the second surface 101d. In some embodiments, the pad 101f is an under bump metallurgy (UBM) pad for receiving the solder bump 103, solder ball, solder paste or etc. The UBM pad is a solderable surface which is exposed for receiving the solder bump 103 and electrically connecting the pad 101f with the circuitry internal to the first layer 101a and/or the second layer 101b. The pad 101f is bonded with the solder bump 103 after heat treatment such as reflow. In some embodiments, the pad 101f includes a conductive material such as gold, silver, copper, nickel, tungsten, aluminum, and/or alloys thereof.

In some embodiments, a molding 102 is disposed over the second layer 101b and surrounds the solder bump 103. In some embodiments, the molding 102 is disposed between the solder bumps 103. The molding 102 covers the second surface 101d and the bottom of the carrier 101, so that the solder bump 103 is partially within the molding 102 and is partially exposed for electrically connecting with a pad on another carrier.

In some embodiments, the molding 102 includes a molding compound. The molding compound can be a single layer film or a composite stack. The molding compound includes various materials, for example, one or more of epoxy resins, phenolic hardeners, silicas, catalysts, pigments, mold release agents, and the like. Each of the materials for forming the molding compound has a high thermal conductivity, a low moisture absorption rate, a high flexural strength at board-mounting temperatures, or a combination of these.

In some embodiments, the molding 102 has a protruded portion 102a protruding from a sidewall 101g of the carrier 101. In some embodiments, the sidewall 101g includes a sidewall 101k of an end portion of the first layer 101a and a sidewall 101j of an end portion of the second layer 101b. The sidewall 101k of the end portion of the first layer 101a is aligned with the sidewall 101j of the end portion of the second layer 101b. The sidewall 101g of the carrier 101 is extended vertically from the first surface 101c to the second surface 101d. The protruded portion 102a of the molding 102 is not covered by the first layer 101a and the second layer 101b.

In some embodiments, the protruded portion 102a has a sidewall 102b. The sidewall 102b of the protruded portion 102a is extended parallel to the sidewall 101g of the carrier 101, but the sidewall 102b is not aligned with the sidewall 101g. In some embodiments, the sidewall 101g and the sidewall 102b are in a stepped configuration. In some embodiments, the protruded portion 102a is protruded from the sidewall 101g in a length $L_{mold}$. The length $L_{mold}$ is about 6 um. In some embodiments, the length $L_{mold}$ is about 4 um to about 10 um.

Figure 2:
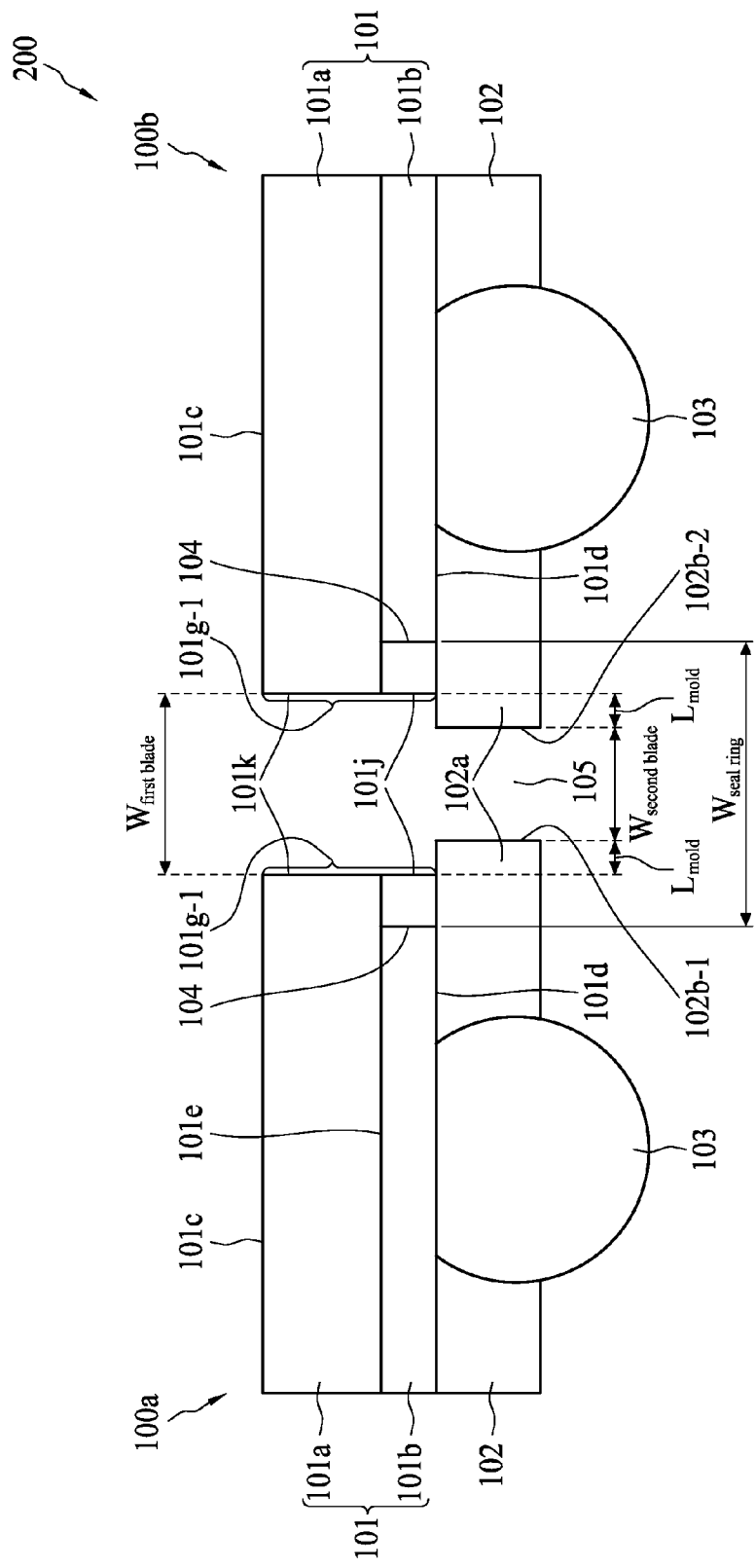
FIG. 2 is a schematic view of a semiconductor wafer including two semiconductor devices of FIG. 1 in accordance with some embodiments of the present disclosure.

FIG. 2 is an embodiment of a portion of a semiconductor wafer 200 including a first semiconductor device 100a and a second semiconductor device 100b. The semiconductor device 100a and the semiconductor device 100b respectively have similar configuration and structure as the semiconductor device 100 as in FIG. 1. The semiconductor wafer 200 is sawed above a position 105 in order to singulate out the first semiconductor device 100a and the second semiconductor device 100b from the semiconductor wafer 200. In some embodiments, the position 105 is between at least two of the solder bumps 103.

In some embodiments, a first layer 101a and a second layer 101b is sawed by a first blade to form a sidewall 101g-1 of the first semiconductor device 100a and a sidewall 101g-2 of the second semiconductor device 100b. The sidewall 101g-1 and the sidewall 101g-2 are respectively extended from the first surface 101c to the second surface 101d.

In some embodiments, the sidewall 101g-1 is substantially in a same length as the sidewall 101g-2. In some embodiments, there is a distance $W_{first\ blade}$ between the sidewall 101g-1 and the sidewall 101g-2. In some embodiments, the distance $W_{first\ blade}$ is a width or diameter of the first blade. In some embodiments, the distance $W_{first\ blade}$ is about 42 um. In some embodiments, the distance $W_{first\ blade}$ is about 32 um to about 52 um.

In some embodiments, a protruded portion 102a of a molding 102 is sawed by a second blade to form a sidewall 102b-1 of the first semiconductor device 100a and a sidewall 102b-2 of the second semiconductor device 100b. In some embodiments, the sidewall 102b-1 is substantially in a same length as the sidewall 102b-2. In some embodiments, there is a distance $W_{second\ blade}$ between the sidewall 102b-1 and the sidewall 102b-2. In some embodiments, the distance $W_{second\ blade}$ is a width or diameter of the second blade. In some embodiments, the distance $W_{second\ blade}$ is about 30 um. In some embodiments, the distance $W_{second\ blade}$ is about 20 um to about 40 um.

In some embodiments, the sidewall 101g-1 and the sidewall 102b-1 are in a stepped configuration. In some embodiments, the sidewall 101g-2 and the sidewall 102b-2 are in a stepped configuration. An end portion of the carrier 101 and an end portion of the molding 102 are formed in a stepped configuration. That is, an end portion of the semiconductor device 100a or semiconductor device 100b is in a stepped configuration.

In some embodiments, the second layer 101b has a seal ring 104 surrounding a die respectively on the semiconductor device 100a and the semiconductor device 100b. The seal ring 104 is contacted with the die and is disposed along an outer edge of the die. In some embodiments, the seal ring 104 is adjacent to a scribing line for singulating the die out of the semiconductor wafer 200. In some embodiments, the seal ring 104 is configured as a barrier for preventing the die from moisture, corrosive chemicals or etc. In some embodiments, the seal ring 104 has a width $W_{seal\ ring}$ of about 80 um. In some embodiments, the seal ring 104 has the width $W_{seal\ ring}$ of about 60 um to about 100 um.

Figure 3:
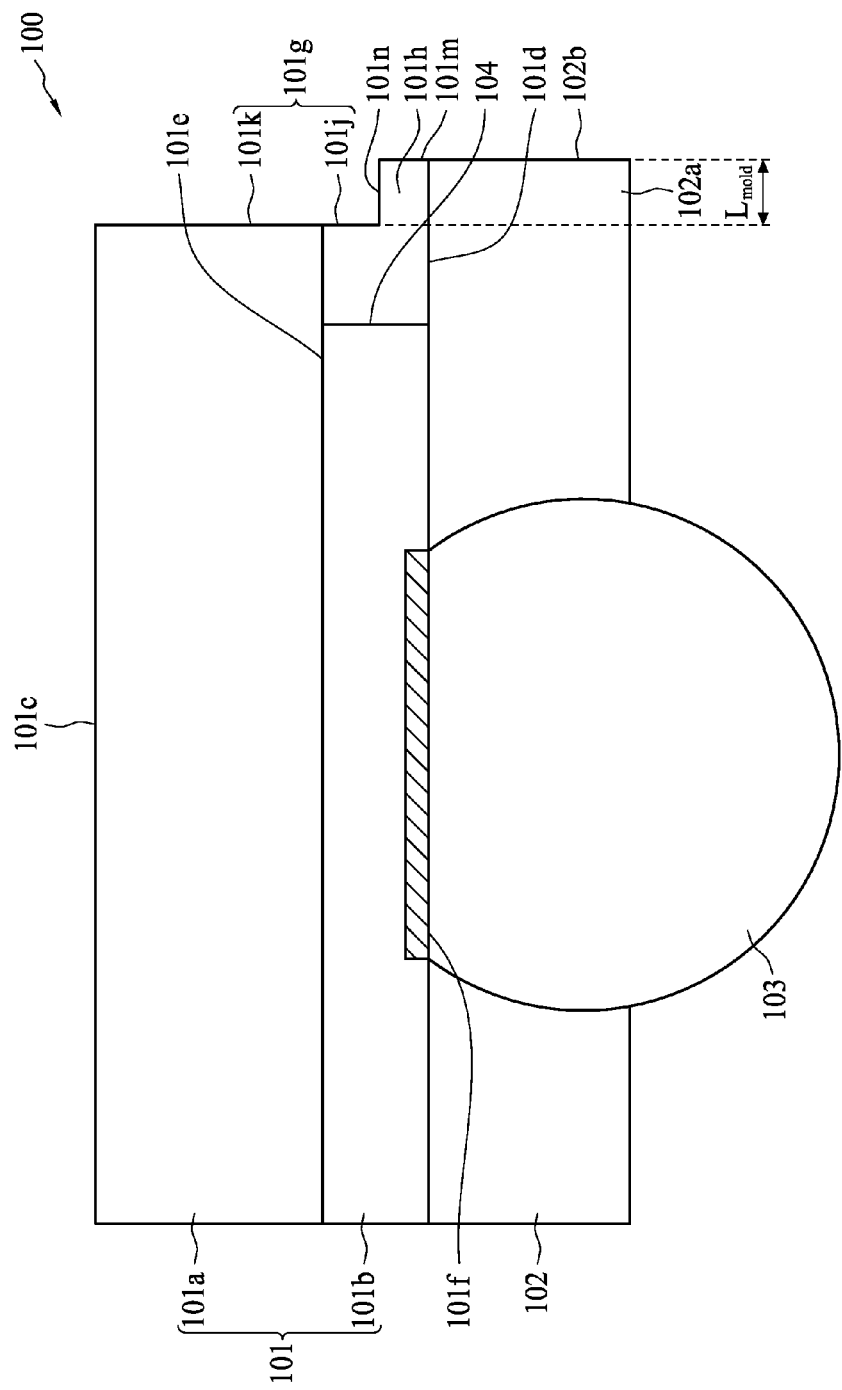
FIG. 3 is a schematic view of a semiconductor device with a protruded portion of a second layer in accordance with some embodiments of the present disclosure.

FIG. 3 is an embodiment of a semiconductor device 100. The semiconductor device 100 includes a carrier 101. The carrier 101 includes a first layer 101a, a second layer 101b, a first surface 101c and a second surface 101d. In some embodiments, the first surface 101c is a top surface of the carrier 101, and the second surface 101d is a bottom surface of the carrier 101. In some embodiments, the first layer 101a is a substrate layer, and the second layer 101b is an RDL or IMD layer. In some embodiments, the carrier 101 has a sidewall 101g at an end portion of the carrier 101. The sidewall 101g is extended from the first surface 101c to a position above the second surface 101d.

In some embodiments, the sidewall 101g includes a sidewall 101k of the first layer 101a and a sidewall 101j of the second layer 101b. The sidewall 101g extends vertically across an end portion of the first layer 101a and an end portion of the second layer 101b.

In some embodiments, a solder bump 103 is disposed on the second surface 101d. In some embodiments, the solder bump 103 is disposed on a UBM pad on the second surface 101d of the second layer 101b.

In some embodiments, a molding 102 is disposed on the second surface 101d. The molding 102 is over the second layer 101d and surrounds a part of the solder bump 103. In some embodiments, the molding 102 has a protruded portion 102a protruding from the sidewall 101k of the first layer 101a and the sidewall 101j of the second layer 101b.

In some embodiments, the second layer 101b has a protruded portion 101h. The protruded portion 101h is protruded from the sidewall 101j of the second layer 101b. The protruded portion 101h is disposed above the protruded portion 102a of the molding 102 and is extended along the second surface 101d of the second layer 101b. In some embodiments, the protruded portion 101h is extended along the second surface 101d of the second layer 101b. In some embodiments, the protruded portion 101h of the second layer 101b is protruded in a substantially same length as the protruded portion 102a of the molding 102.

In some embodiments, the protruded portion 101h of the second layer 101b has a sidewall 101m at the end portion of the second layer 101b. The sidewall 101m is extended between a top surface 101n of the second layer 101b and the second surface 101d of the second layer 101b. In some embodiments, the sidewall 101m of the protruded portion 101h is aligned with the sidewall 102b of the molding 102. The sidewall 101m and the sidewall 102b are extended vertically along the end portion of the second layer 101b and an end portion of the molding 102. In some embodiments, the sidewall 101j and the top surface 101n are in a stepped configuration. The end portion of the second layer 101b is in the stepped configuration. In some embodiments, the end portion of the second layer 101b is in a L-shape.

Figure 4:
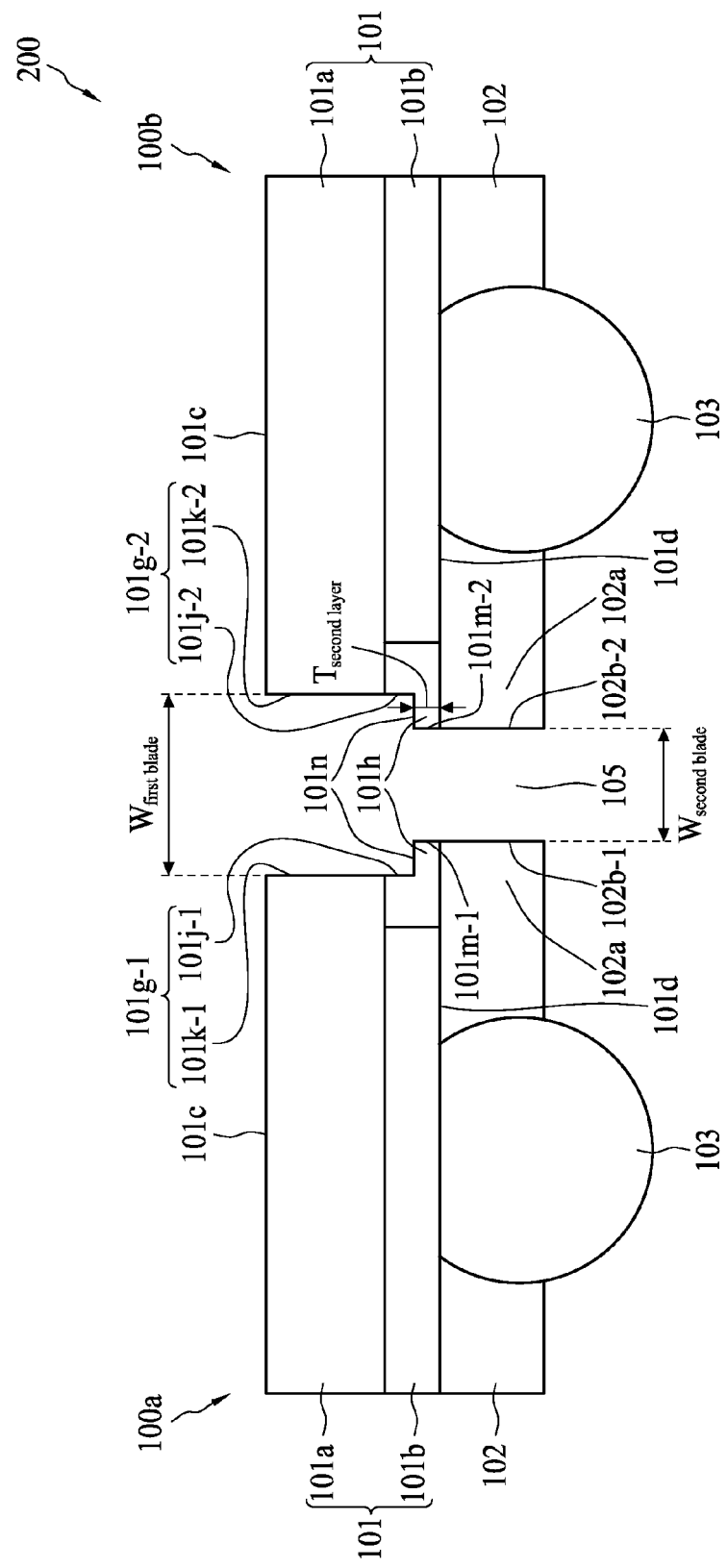
FIG. 4 is a schematic view of a semiconductor wafer including two semiconductor devices of FIG. 3 in accordance with some embodiments of the present disclosure.

FIG. 4 is an embodiment of a portion of a semiconductor wafer 200 including a first semiconductor device 100a and a second semiconductor device 100b. The semiconductor device 100a and the semiconductor device 100b respectively have similar configuration and structure as the semiconductor device 100 as in FIG. 3. The semiconductor wafer 200 is sawed above a position 105 between at least two of the solder bumps 103 in order to singulate out the first semiconductor device 100a and the second semiconductor device 100b from the semiconductor wafer 200.

In some embodiments, a first layer 101a and a second layer 101b is sawed by a first blade to form a sidewall 101g-1 of the first semiconductor device 100a and a sidewall 101g-2 of the second semiconductor device 100b. The sidewall 101g-1 and the sidewall 101g-2 are respectively extended from a first surface 101c to a position above a second surface 101d. The sidewall 101g-1 includes a sidewall 101k-1 of the first layer 101a and a sidewall 101j-1 of the second layer. The sidewall 101g-2 includes a sidewall 101k-2 of the first layer 101a and a sidewall 101j-2 of the second layer.

In some embodiments, the sidewall 101g-1 is substantially in a same length as the sidewall 101g-2. In some embodiments, there is a distance $W_{first\ blade}$ between the sidewall 101g-1 and the sidewall 101g-2. In some embodiments, the distance $W_{first\ blade}$ is a width or diameter of the first blade. In some embodiments, the distance $W_{first\ blade}$ is about 42 um. In some embodiments, the distance $W_{first\ blade}$ is about 32 um to about 52 um.

In some embodiments, a protruded portion 102a of a molding 102 and a protruded portion 101h of the second layer 101b are sawed by a second blade to form a sidewall 101m-1 of the protruded portion 101h of the first semiconductor device 100a, a sidewall 102b-1 of the protruded portion 101h of the first semiconductor device 100a, a sidewall 101m-2 of the protruded portion 101h of the second semiconductor device 100b and a sidewall 102b-2 of the protruded portion 102a of the second semiconductor device 100b. In some embodiments, the sidewall 101m-1 and the sidewall 102b-1 are substantially in a same length as the sidewall 101m-2 and the sidewall 102b-2.

In some embodiments, there is a distance $W_{second\ blade}$ between the sidewall 101m-1 and the sidewall 101m-2 and between the sidewall 102b-1 and the sidewall 102b-2. In some embodiments, the distance $W_{second\ blade}$ is a width or diameter of the second blade. In some embodiments, the distance $W_{second\ blade}$ is about 30 um. In some embodiments, the distance $W_{second\ blade}$ is about 20 um to about 40 um.

In some embodiments, the protruded portion 101h of the second layer 101b has a thickness $T_{second\ layer}$. The thickness $T_{second\ layer}$ is a distance between a top surface 101n of the protruded portion 101h of the second layer 101b and a second surface 101d of the second layer 101b. In some embodiments, the thickness $T_{second\ layer}$ is equal to or smaller than about 5 um. In some embodiments, the thickness $T_{second\ layer}$ is equal to or smaller than about 8 um.

In some embodiments, the second layer 101b of the first semiconductor device 100a and the second semiconductor device 100b are respectively in a stepped configuration. In some embodiments, the sidewall 101j-1, the sidewall 101m-1 and the top surface 101n are in a stepped configuration, and the sidewall 101j-2, the sidewall 101m-2 and the top surface 101n are also in a stepped configuration.

Figure 5:
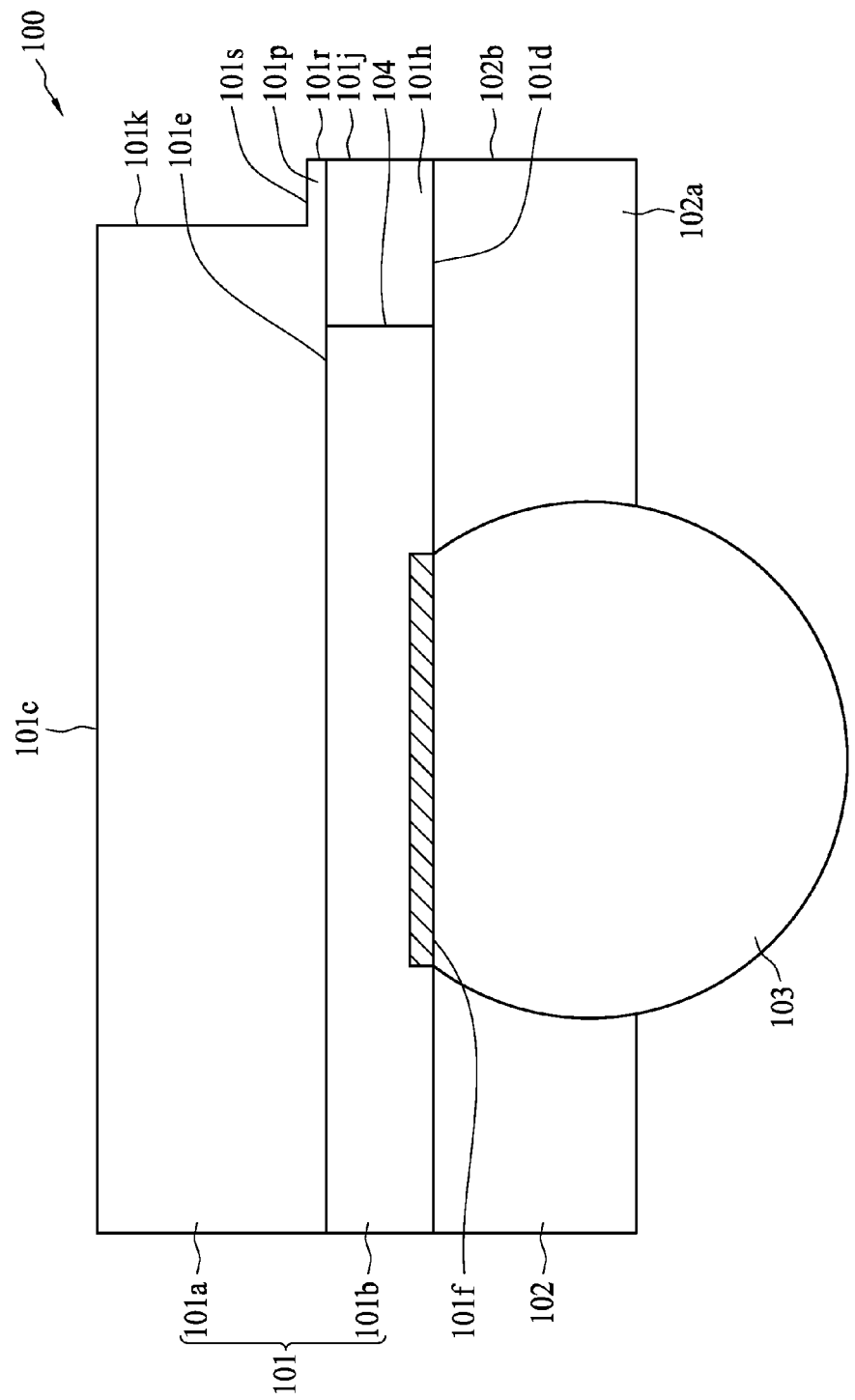
FIG. 5 is a schematic view of a semiconductor device with a protruded portion of a first layer in accordance with some embodiments of the present disclosure.

FIG. 5 is an embodiment of a semiconductor device 100. The semiconductor device 100 includes a carrier 101. The carrier 101 includes a first layer 101a and a second layer 101b. In some embodiments, the first layer 101a is a substrate layer, and the second layer 101b is an RDL or IMD layer. In some embodiments, the carrier 101 includes a first surface 101c and a second surface 101d. In some embodiments, the first surface 101c is a top surface of the carrier 101, and the second surface 101d is a bottom surface of the carrier 101.

In some embodiments, the first layer 101a has a sidewall 101k at an end portion of the first layer 101a. The sidewall 101k extends vertically from the first surface 101c of the carrier 101 to a position above an interface 101e between the first layer 101a and the second layer 101b.

In some embodiments, a solder bump 103 is disposed on the second surface 101d. In some embodiments, a molding 102 is disposed on the second surface 101d. The molding 102 is over the second layer 101b and surrounds a part of the solder bump 103. In some embodiments, the molding 102 has a protruded portion 102a protruding from the sidewall 101k of the first layer 101a. In some embodiments, the protruded portion 102a of the molding 102 has a sidewall 102b at an end portion of the molding 102.

In some embodiments, the second layer 101b has a protruded portion 101h. The protruded portion 101h is protruded from the sidewall 101k of the first layer 101a. The protruded portion 101h is disposed above the protruded portion 102a of the molding 102 and is extended parallel to the second surface 101d of the second layer 101b. In some embodiments, the protruded portion 101h of the second layer 101b has a sidewall 101j at an end portion of the second layer 101b. In some embodiments, the sidewall 101j of the second layer 101b is aligned with the sidewall 102b of the molding 102.

In some embodiments, the first layer 101a has a protruded portion 101p. The protruded portion 101p is protruded from the sidewall 101k of the first layer 101a. The protruded portion 101p has a sidewall 101r extending from a top surface 101s of the protruded portion 101p and the interface 101e between the first layer 101a and the second layer 101b. In some embodiments, the sidewall 101k and the top surface 101s are in a stepped configuration. That is, an end portion of the first layer 101a is in a stepped configuration. In some embodiments, the first layer 101a is in a L-shape at the end portion of the first layer 101a. In some embodiments, the sidewall 101r of the first layer 101a, the sidewall 101j of the second layer and the sidewall 102b of the molding 102 are aligned with each other.

Figure 6:
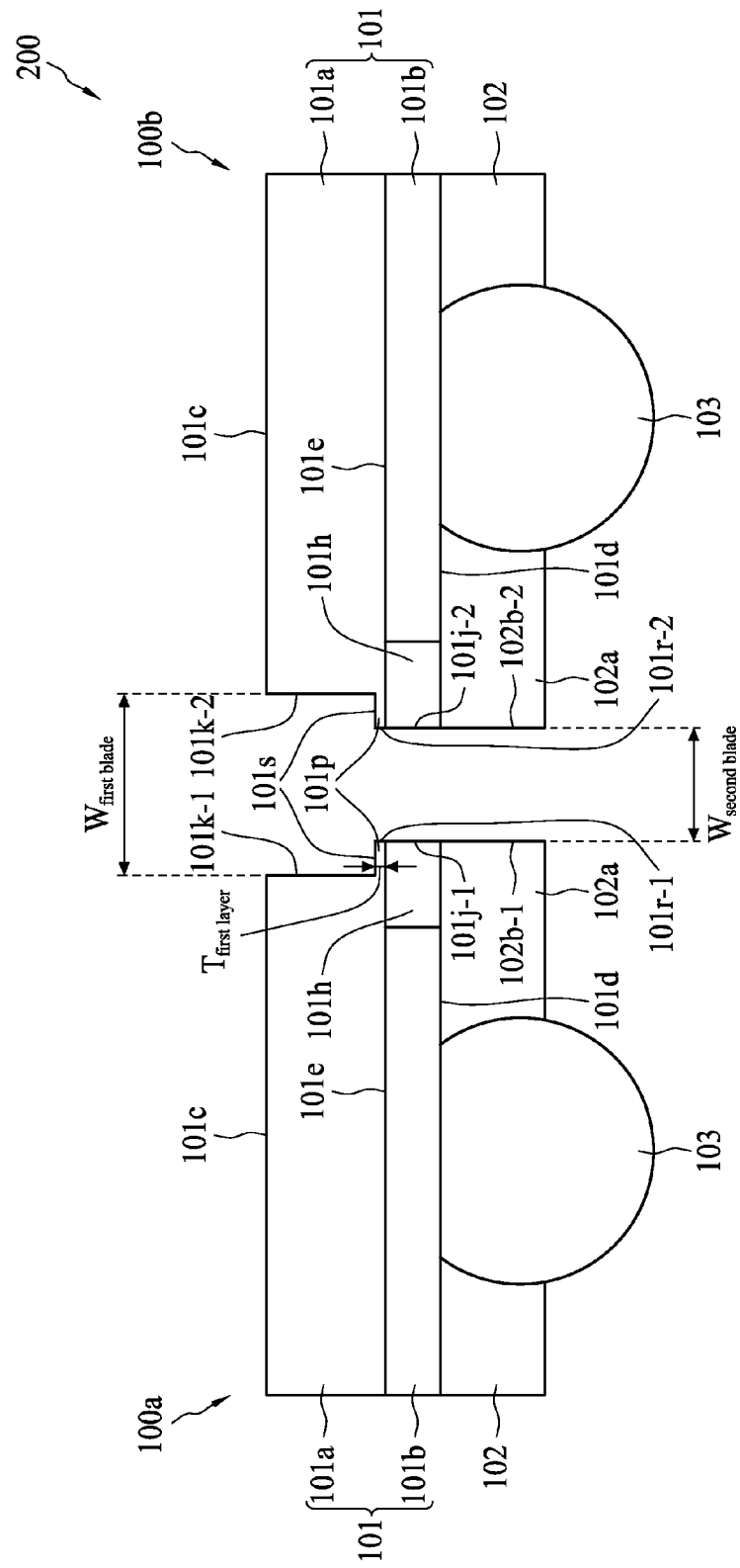
FIG. 6 is a schematic view of a semiconductor wafer including two semiconductor devices of FIG. 5 in accordance with some embodiments of the present disclosure.

FIG. 6 is an embodiment of a portion of a semiconductor wafer 200. The semiconductor wafer 200 includes a first semiconductor device 100a and a second semiconductor device 100b. The semiconductor device 100a and the semiconductor device 100b respectively have similar configuration and structure as the semiconductor device 100 as in FIG. 5. The semiconductor wafer 200 is sawed above a position 105 between at least two of the solder bumps in order to singulate out the first semiconductor device 100a and the second semiconductor device 100b from the semiconductor wafer 200.

In some embodiments, a first layer 101a is sawed by a first blade to form a sidewall 101k-1 of the first layer 101a of the first semiconductor device 100a and a sidewall 101k-2 of the first layer 101a of the second semiconductor device 100b. The sidewall 101k-1 and the sidewall 101k-2 are respectively extended from a first surface 101c to a top surface 101s of a protruded portion 101p of the first layer 101a.

In some embodiments, the sidewall 101k-1 is substantially in a same length as the sidewall 101k-2. In some embodiments, there is a distance $W_{first\ blade}$ between the sidewall 101k-1 and the sidewall 101k-2. In some embodiments, the distance $W_{first\ blade}$ is a width or diameter of the first blade. In some embodiments, the distance $W_{first\ blade}$ is about 42 um. In some embodiments, the distance $W_{first\ blade}$ is about 32 um to about 52 um.

In some embodiments, the protruded portion 101p of the first layer 101a, the protruded portion 101h of the second layer 101b and the protruded portion 102a of the molding 102 are sawed by a second blade to form a sidewall 101r-1 of the protruded portion 101p of the first semiconductor device 100a, a sidewall 101j-1 of the protruded portion 101h of the first semiconductor device 100a, a sidewall 102b-1 of the protruded portion 102a of the molding, a sidewall 101r-2 of the protruded portion 101p of the second semiconductor device 100b, a sidewall 101j-2 of the protruded portion 101h of the second semiconductor device 100b and a sidewall 102b-2 of the protruded portion 102a of the second semiconductor device 100b.

In some embodiments, the sidewall 101r-1, the sidewall 101j-1 and the sidewall 102b-1 are substantially in a same length as the sidewall 101r-2, the sidewall 101j-2 and the sidewall 102b-2. In some embodiments, the sidewall 101r-1, the sidewall 101j-1 and the sidewall 102b-1 are aligned with each other. The sidewall 101r-2, the sidewall 101j-2 and the sidewall 102b-2 are also aligned with each other.

In some embodiments, there is a distance $W_{second\ blade}$ between the sidewall 101r-1 and the sidewall 101r-2, between the sidewall 101j-1 and the sidewall 101j-2, and between the sidewall 102b-1 and the sidewall 102b-2. In some embodiments, the distance $W_{second\ blade}$ is a width or diameter of the second blade. In some embodiments, the distance $W_{second\ blade}$ is about 30 um. In some embodiments, the distance $W_{second\ blade}$ is about 20 um to about 40 um.

In some embodiments, the protruded portion 101p of the first layer 101a has a thickness $T_{first\ layer}$. The thickness $T_{first\ layer}$ is a distance between the top surface 101s of the protruded portion 101p of the first layer 101a and the interface 101e between the first layer 101a and the second layer 101b. In some embodiments, the thickness $T_{first\ layer}$ is equal to or smaller than about 20 um. In some embodiments, the thickness $T_{first\ layer}$ is equal to or smaller than about 30 um.

In some embodiments, the first layer 101a of the first semiconductor device 100a and the second semiconductor device 100b are respectively in a stepped configuration. In some embodiments, the sidewall 101k-1, the top surface 101s and the sidewall 101r-1 are in a stepped configuration. The sidewall 101k-2, the top surface 101s and the sidewall 101r-2 are also in a stepped configuration.

In the present disclosure, a method of manufacturing a semiconductor device is also disclosed. In some embodiments, a semiconductor device is formed by a method 300. The method 300 includes a number of operations and the description and illustration are not deemed as a limitation as the sequence of the operations.

Figure 7:
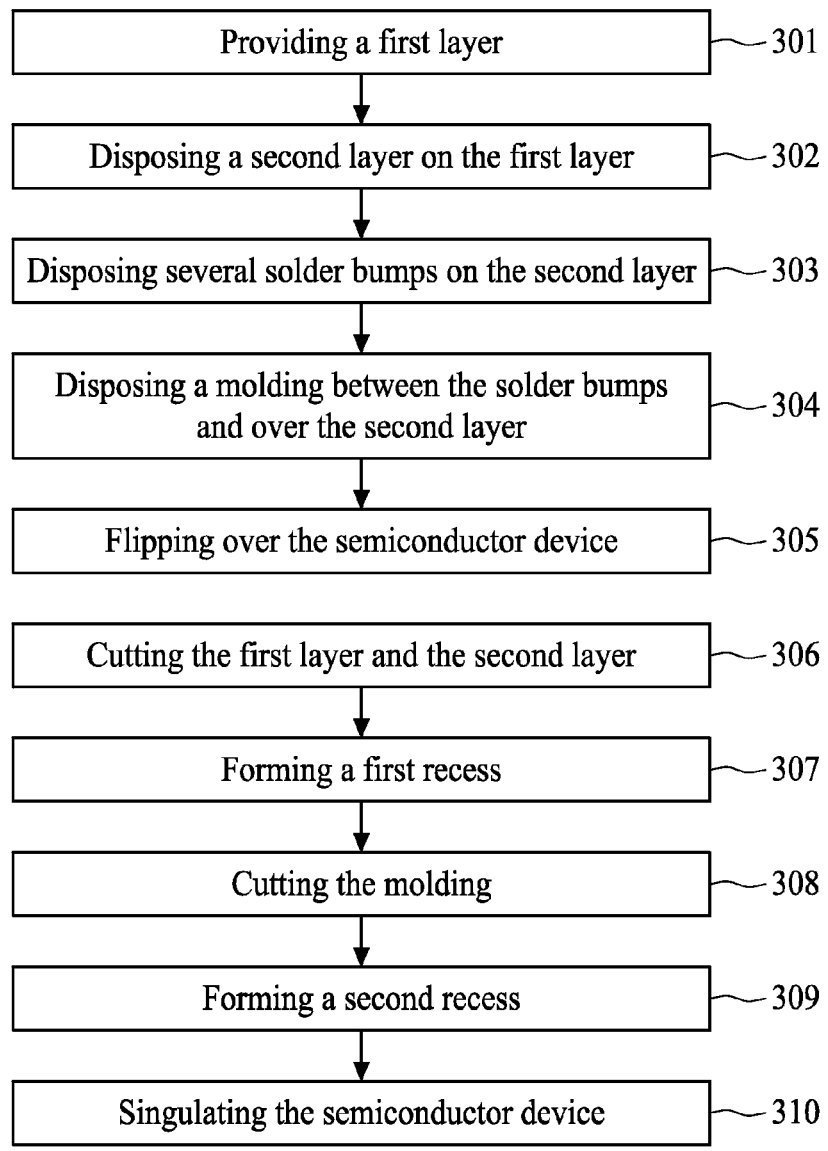
FIG. 7 is a flow diagram of a method of manufacturing a semiconductor device in accordance with some embodiments of the present disclosure.

FIG. 7 is an embodiment of a method 300 of manufacturing a semiconductor device. The method 300 includes a number of operations (301, 302, 303, 304, 305, 306, 307, 308, 309, 310).

Figure 7A:
FIG. 7A is a schematic view of a first layer in accordance with some embodiments of the present disclosure.

In operation 301, a first layer 101a is provided as in FIG. 7A. In some embodiments, the first layer 101a is a substrate layer for supporting several semiconductor components and carrying a circuitry within the substrate layer. In some embodiments, the first layer 101a includes silicon, aluminum or etc.

Figure 7B:
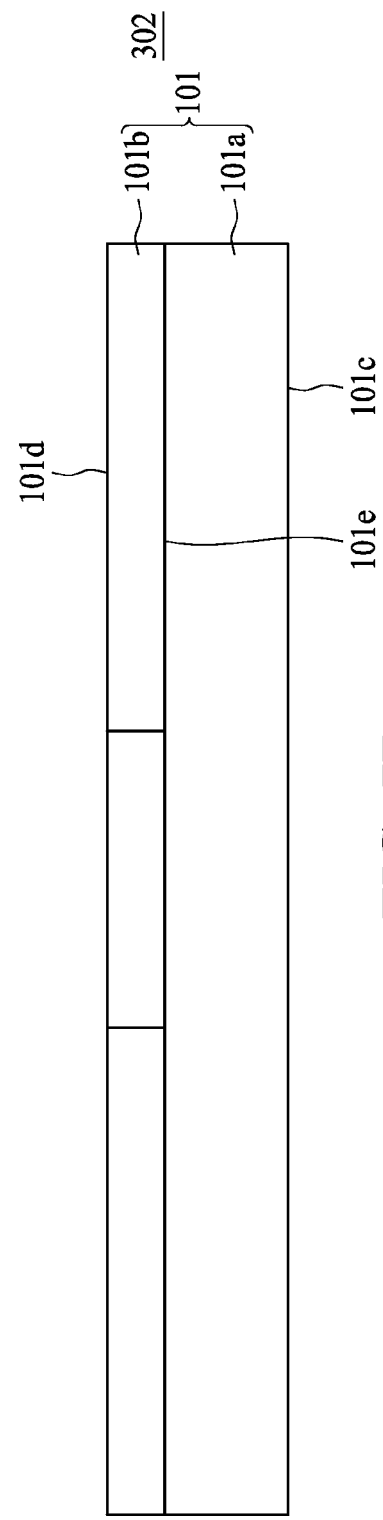
FIG. 7B is a schematic view of a first layer and a second layer in accordance with some embodiments of the present disclosure.

In operation 302, a second layer 101b is disposed on the first layer 101a as in FIG. 7B. In some embodiments, the second layer 101b is a redistribution layer (RDL) including conductive materials for electrically connecting the circuitry of the first layer 101a with a circuitry external to the first layer 101a and the second layer 101b. In some embodiments, the first layer 101a and the second layer 101b forms a carrier 101. In some embodiments, the carrier 101 has a first surface 101c and a second surface 101d.

Figure 7C:
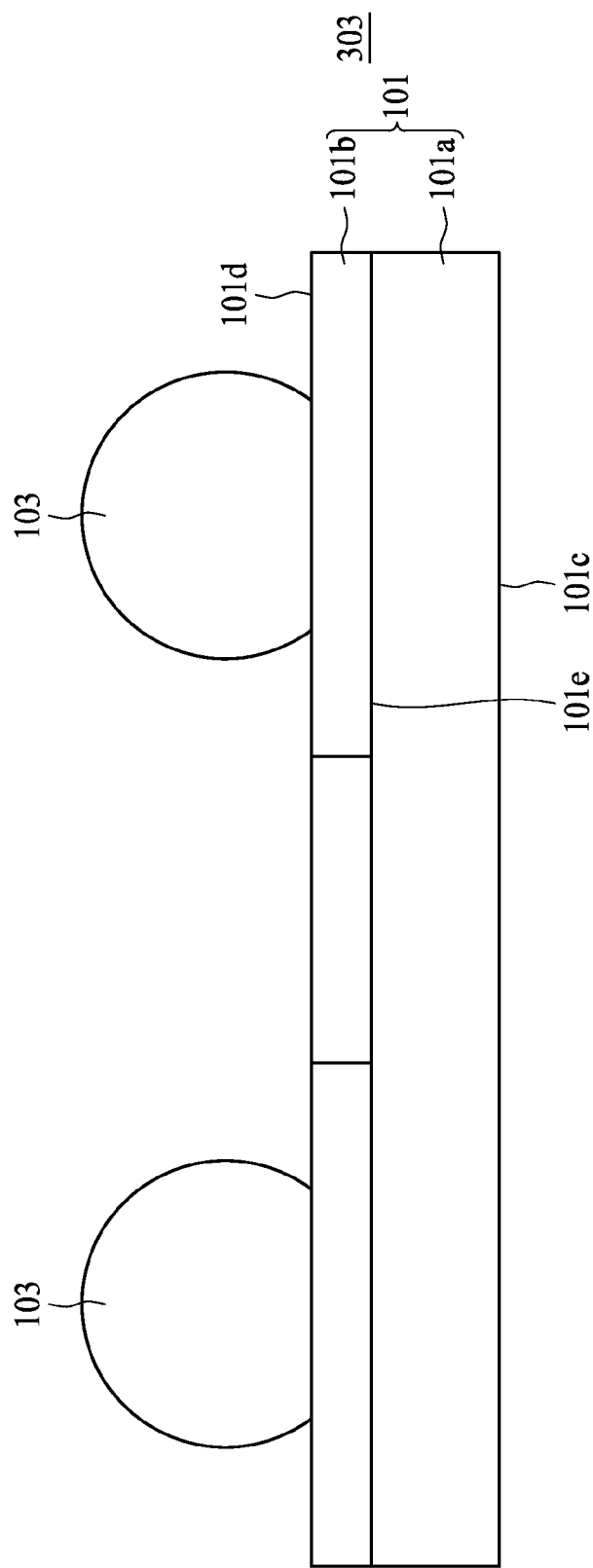
FIG. 7C is a schematic view of several solder bumps on a second layer in accordance with some embodiments of the present disclosure.

In operation 303, several solder bumps 103 are disposed on the second layer 101b as in FIG. 7C. In some embodiments, the solder bumps 103 are disposed on the second surface 101d of the second layer 101b. In some embodiments, the solder bumps 103 are intervally disposed and are spaced away from each other. In some embodiments, the solder bumps 103 are spaced in a substantially same distance with each other. Each of the solder bumps 103 is configured for bonding with a pad of another carrier.

In operation 304, a molding 102 is disposed on the second surface 101d of the second layer 101b. In some embodiments, the molding 102 is disposed between two of the solder bumps 103. The molding 102 covers the second layer 101b. The solder bumps 103 are partially within the molding 102 and are partially exposed for electrically connecting with a pad on another carrier.

Figure 7D:
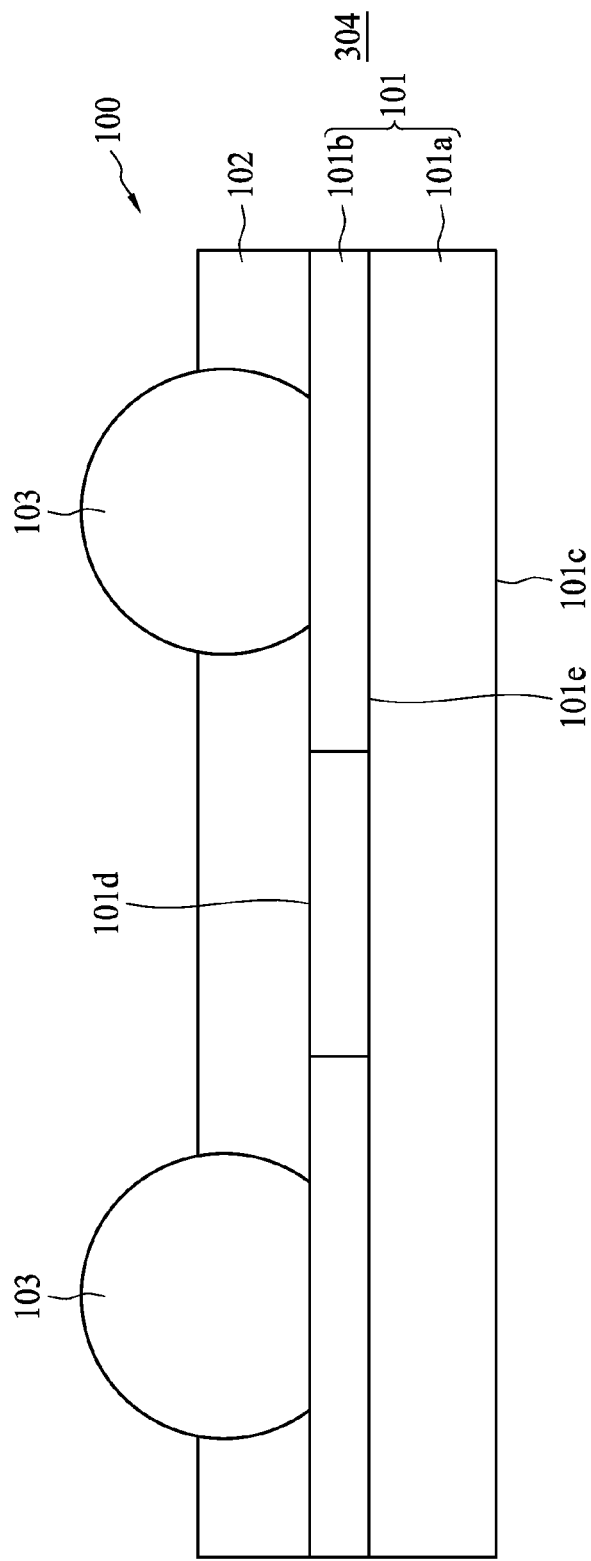
FIG. 7D is a schematic view of a molding on a second layer in accordance with some embodiments of the present disclosure.
Figure 7E:
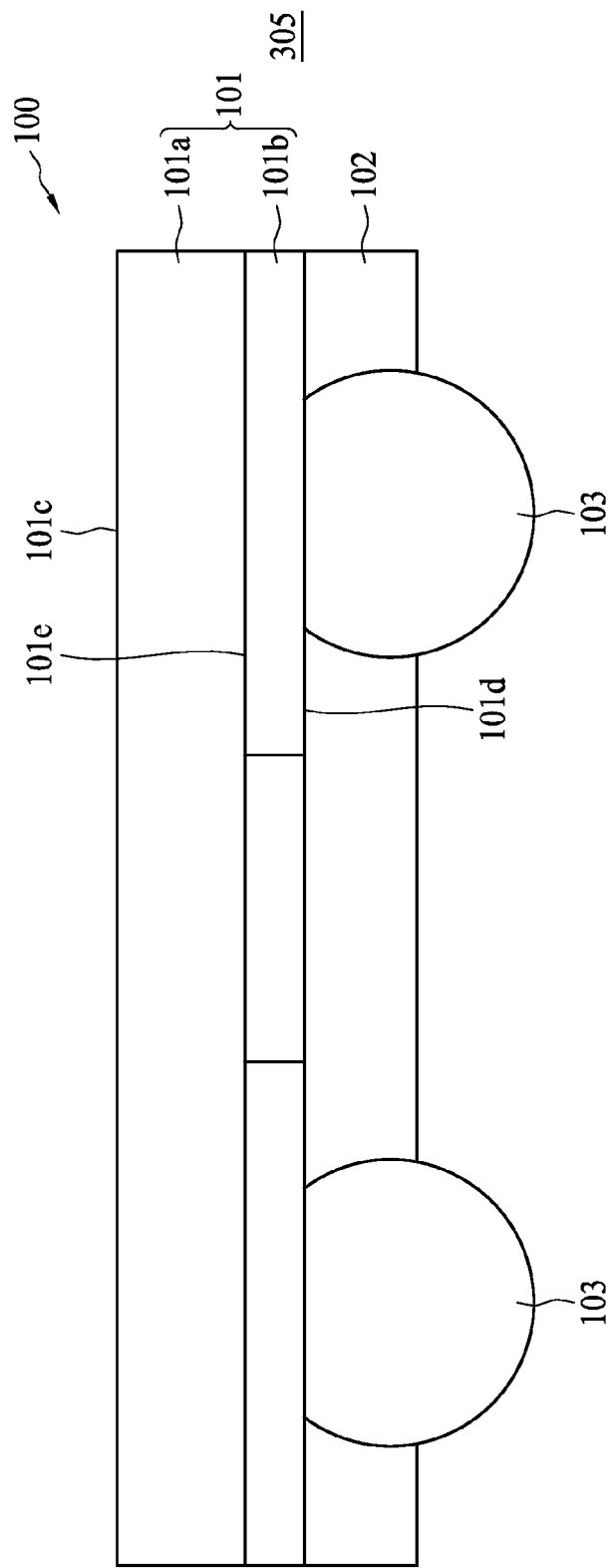
FIG. 7E is a schematic view of several solder bumps facing downward in accordance with some embodiments of the present disclosure.

In operation 305, the semiconductor device 100 is flipped over as in FIG. 7E. In some embodiments, the solder bumps 103 are faced downward after flipping over the semiconductor device 100. As such, the first surface 101c becomes a top surface of the semiconductor device 100. The first layer 101a is disposed on top of the semiconductor device 100, while the molding 102 is disposed at bottom of the semiconductor device 100. In some embodiments, the semiconductor device 100 is flipped by an equipment such as a clipper, a clamp or etc. In some embodiments, the semiconductor device 100 is aligned with reference to the first surface 101c of the first layer 101a prior to cutting of the first layer 101a. In some embodiments, the semiconductor device 100 is aligned by an infra red (IR) inspection such as IR inspector, so that the semiconductor device 100 is aligned for subsequent cutting operations or other assembling operations.

Figure 7F:
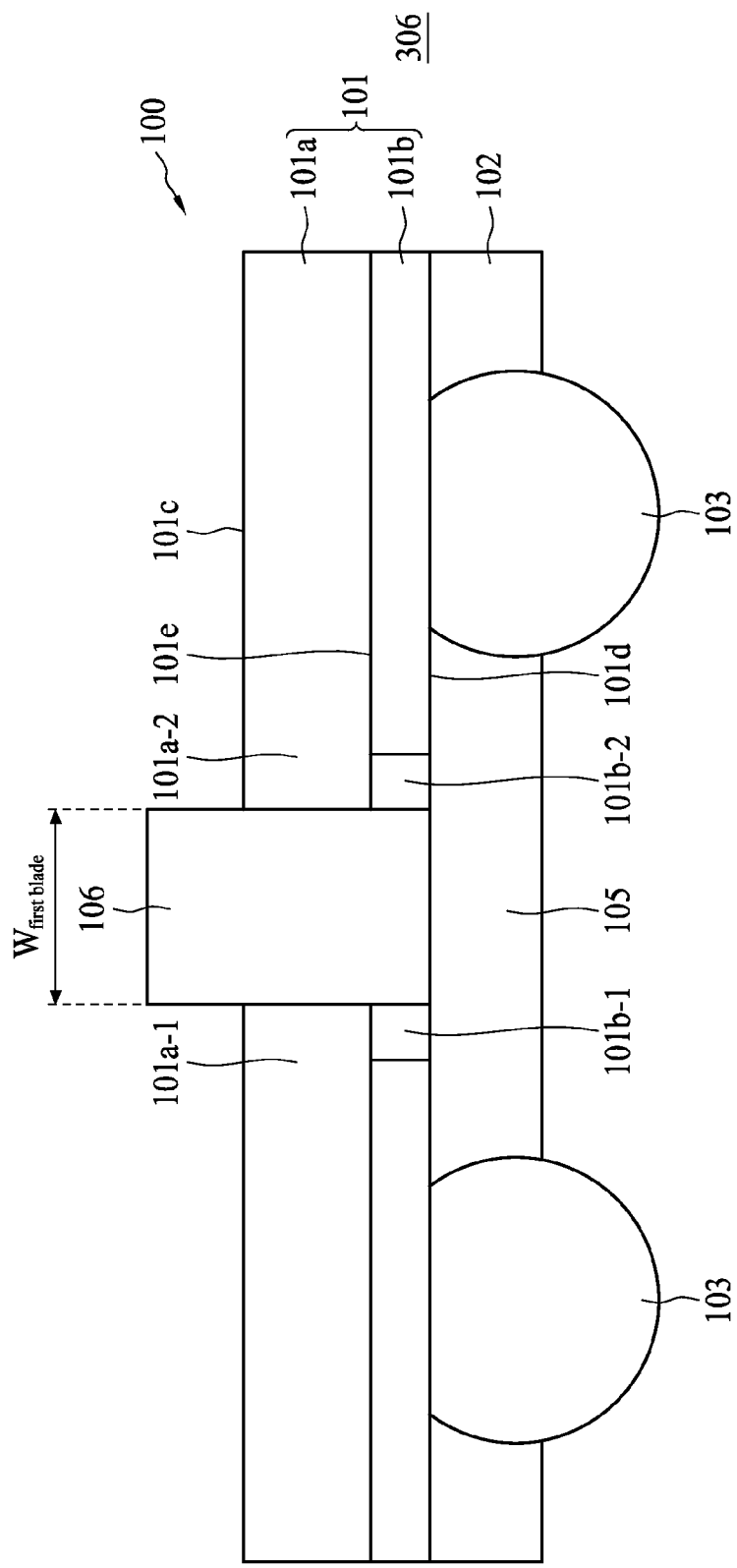
FIG. 7F is a schematic view of a semiconductor device cut by a first blade in accordance with some embodiments of the present disclosure.

In operation 306, the first layer 101a and the second layer 101b are cut by a first blade 106 as in FIG. 7F. In some embodiments, the first layer 101a and the second layer 101b are cut above a position 105. The position 105 is between at least two of the solder bumps 103. The first blade 106 is moved downward towards the first layer 101a and the second layer 101b at the position 105, so as to remove some of the first layer 101a and the second layer 101b. As such, the first layer 101a is split into two portions (101a-1, 101a-2), and the second layer 101b is also split into two portions (101b-1, 101b-2). In some embodiments, the first blade 106 is a mechanical saw. In some embodiments, the first blade 106 has a width $W_{first\ blade}$. In some embodiments, the first blade 106 is a circular saw and has a diameter as the width $W_{first\ blade}$ of the first blade 106.

Figure 7G:
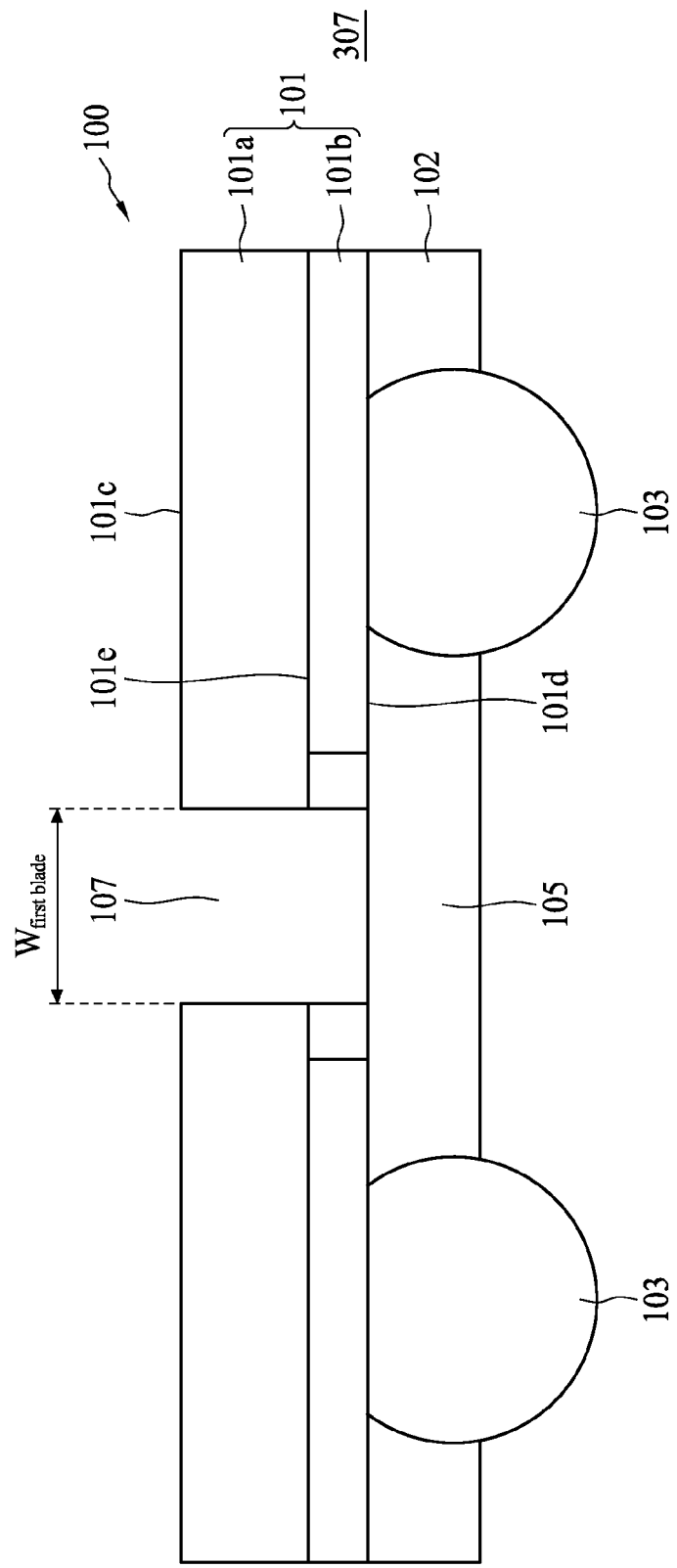
FIG. 7G is a schematic view of a semiconductor device with a first recess in accordance with some embodiments of the present disclosure.

In operation 307, a first recess 107 is formed in the first layer 101a and the second layer 101b above the position 105 as in FIG. 7G. The first recess 107 is above the position 105 between at least two solder bumps 103. The first blade 106 (refers to FIG. 7F) cuts the first layer 101a and the second layer 101b to form the first recess 107. In some embodiments, the first recess 107 has a width which is substantially the same as the width $W_{first\ blade}$ of the first blade 106. In some embodiments, the first recess 107 extends from the first surface 101c to the second surface 101d.

Figure 7H:
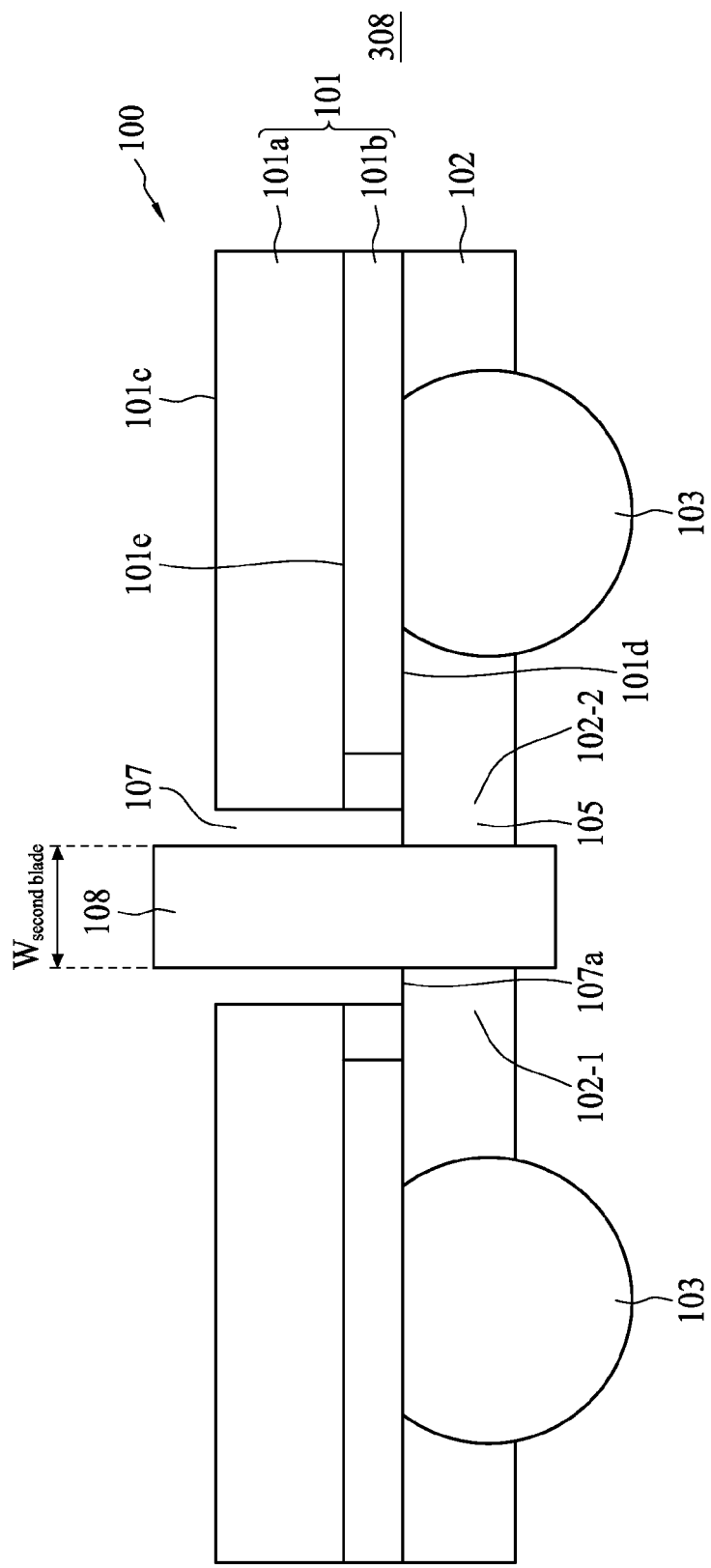
FIG. 7H is a schematic view of a semiconductor device cut by a second blade in accordance with some embodiments of the present disclosure.

In operation 308, the molding 102 is cut from a bottom surface 107a of the first recess 107 by a second blade 108 as in FIG. 7H. In some embodiments, the first blade 106 (refers to FIG. 7F) is changed to the second blade 108. The second blade 108 is used to cut the molding 102 between at least two of the solder bumps 103. The second blade 108 is moved downward towards the bottom of the semiconductor device 100, so as to remove some of the molding 102 between at least two of the solder bumps 103. The molding 102 is completely split into two portions (102-1, 102-2). In some embodiments, the second blade 108 is a mechanical saw. In some embodiments, the second blade 108 has a width $W_{second\ blade}$. In some embodiments, the second blade 108 is a circular saw and has a diameter as the width $W_{second\ blade}$ of the second blade 108. In some embodiments, the width $W_{second\ blade}$ of the second blade 108 is smaller than the width $W_{first\ blade}$ of the first blade 106 (refers to FIG. 7F).

Figure 7I:
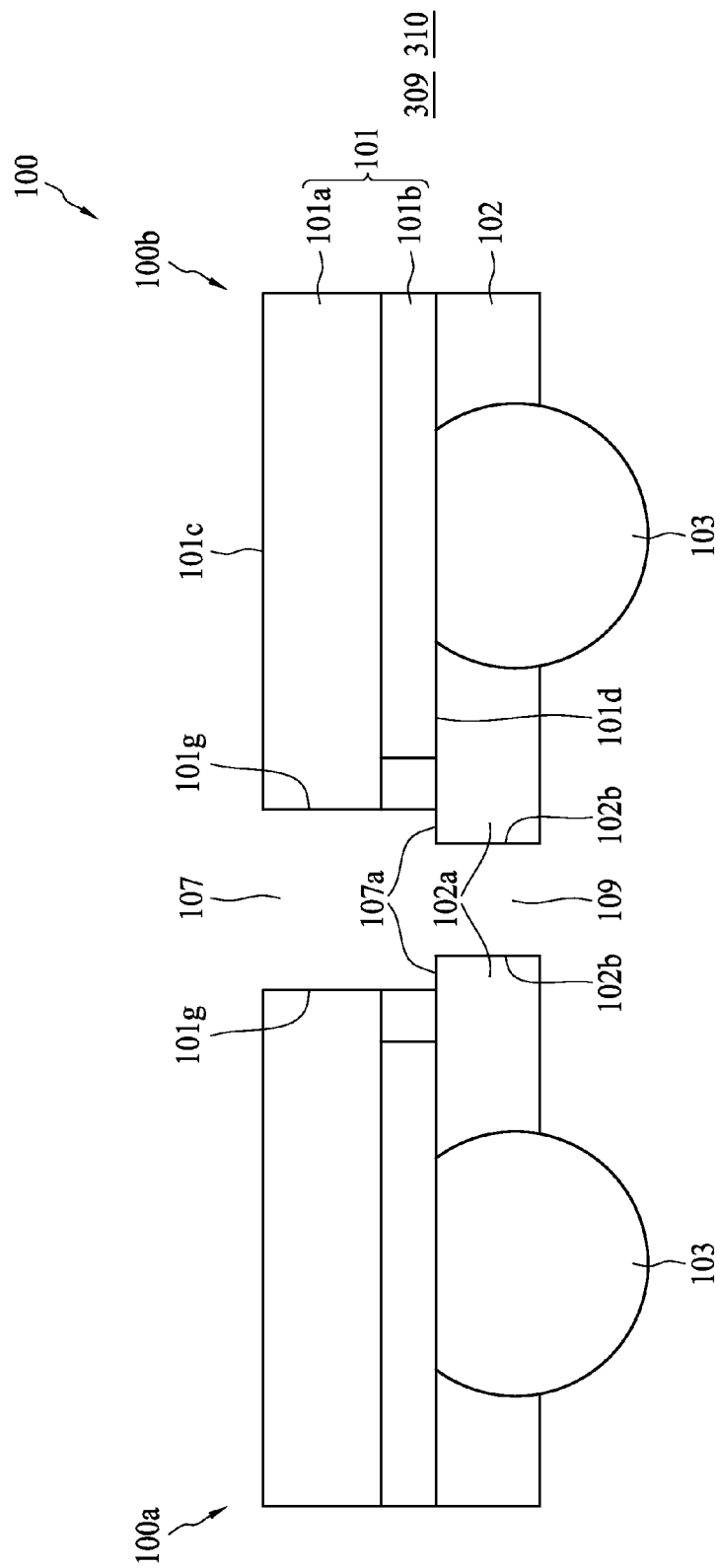
FIG. 7I is a schematic view of a semiconductor device with a first recess and a second recess in accordance with some embodiments of the present disclosure.

In operation 309, a second recess 109 is formed in the molding 102 between at least two of the solder bumps 103 as in FIG. 7I. The second blade 108 cuts the molding 102 to form the second recess 109. In some embodiments, the second recess 109 has a width which is substantially the same as the width $W_{second\ blade}$ of the second blade 108. In some embodiments, the second recess 109 extends from the bottom surface 107a of the first recess 107 to the bottom of the semiconductor device 100. The first recess 107 is located above the second recess 109.

In operation 310, the semiconductor device 100a and the semiconductor device 100b are singulated as in FIG. 7I. They are individualized after cutting of the first layer 101a and the second layer 101b by the first blade 106 (refers to FIG. 7F) and cutting of the molding 102 by the second blade 108 (refers to FIG. 7H). In some embodiments, the first recess 107 and the second recess 109 are in a stepped configuration, so that the molding 102 has a protruded portion 102a protruding from a sidewall 101g of the first recess 107. The semiconductor device 100a and the semiconductor device 100b respectively have a stepped sidewall including a sidewall 102b of the molding 102, the bottom surface 107a of the first recess 107 and the sidewall 101g of the first layer 101a and the second layer 102.

Figure 8:
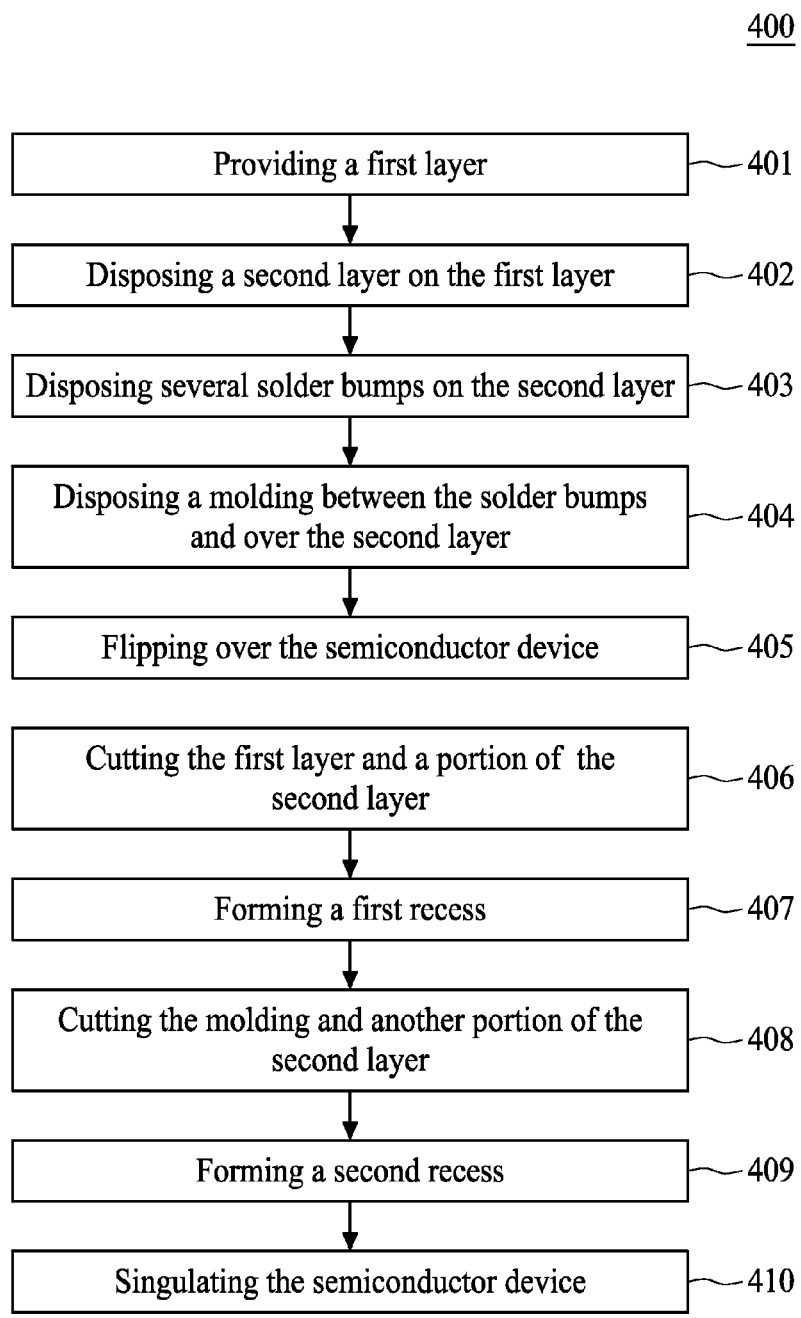
FIG. 8 is a flow diagram of a method of manufacturing a semiconductor device in accordance with some embodiments of the present disclosure.

FIG. 8 is an embodiment of a method 400 of manufacturing a semiconductor device. The method 400 includes a number of operations (401, 402, 403, 404, 405, 406, 407, 408, 409, 410).

Figure 8A:
FIG. 8A is a schematic view of a first layer in accordance with some embodiments of the present disclosure.
Figure 8B:
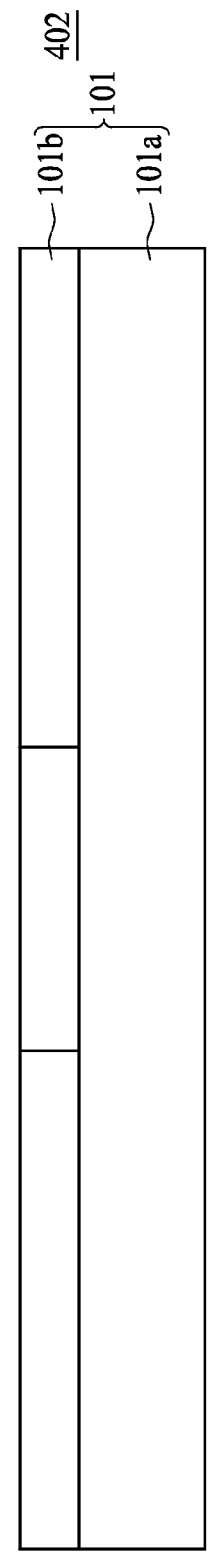
FIG. 8B is a schematic view of a first layer and a second layer in accordance with some embodiments of the present disclosure.
Figure 8C:
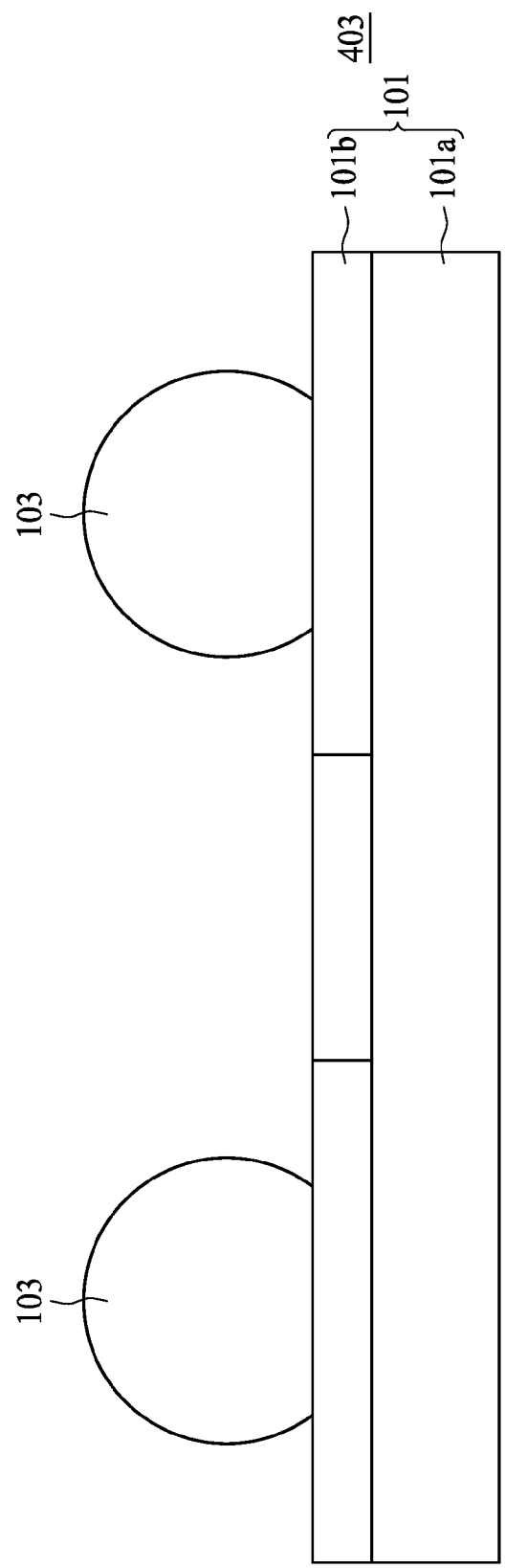
FIG. 8C is a schematic view of several solder bumps on a second layer in accordance with some embodiments of the present disclosure.
Figure 8D:
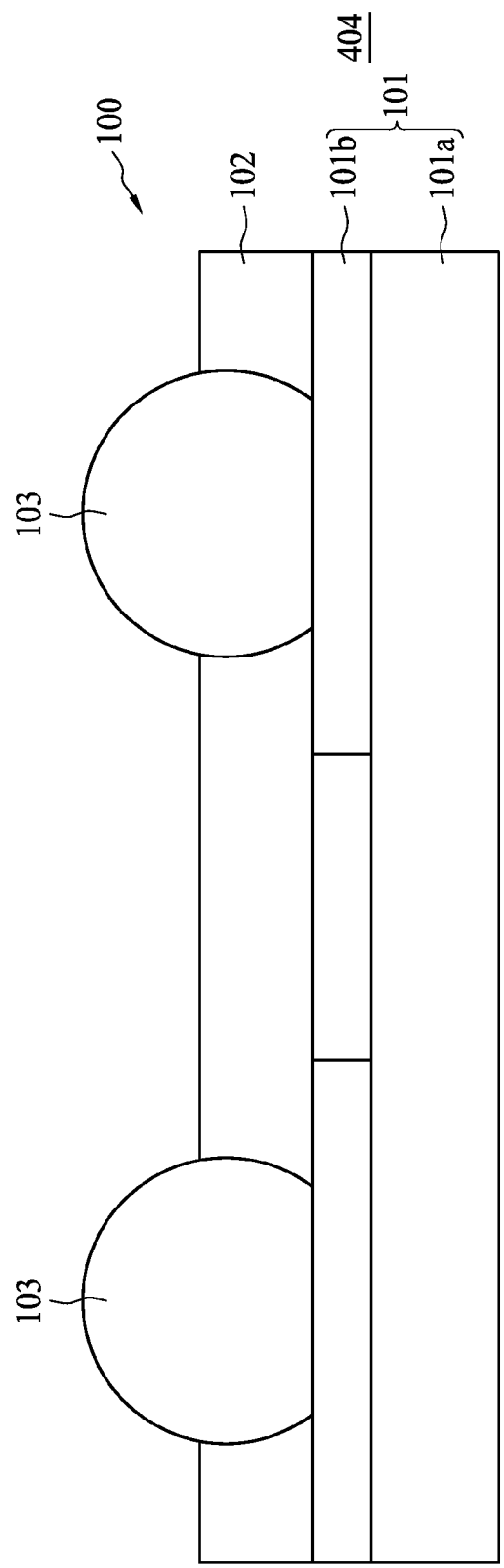
FIG. 8D is a schematic view of a molding on a second layer in accordance with some embodiments of the present disclosure.
Figure 8E:
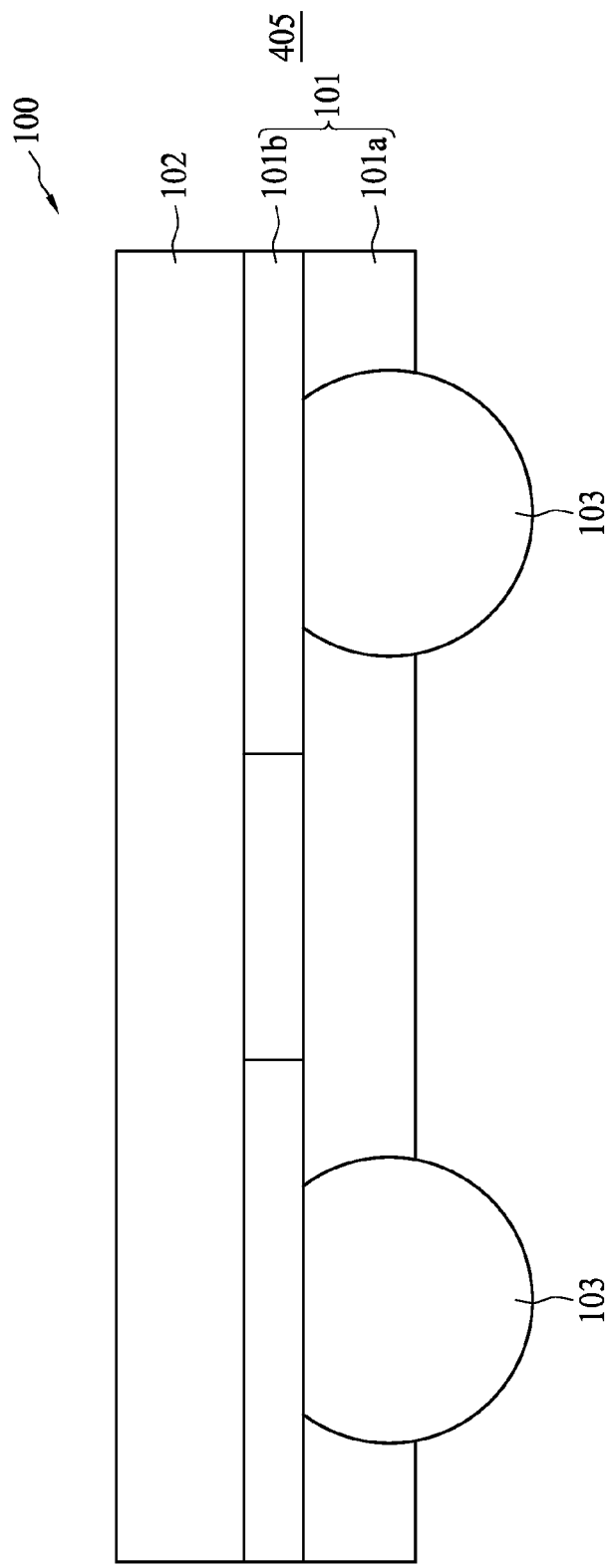
FIG. 8E is a schematic view of several solder bumps facing downward in accordance with some embodiments of the present disclosure.

In operation 401, a first layer 101a is provided as in FIG. 8A, similar to the operation 301 in FIGS. 7 and 7A. In operation 402, a second layer 101b is disposed on the first layer 101a as in FIG. 8B, similar to the operation 302 in FIGS. 7 and 7B. In operation 403, several solder bumps 103 are disposed on the second layer 101b as in FIG. 8C, similar to the operation 303 in FIGS. 7 and 7C. In operation 404, a molding 102 is disposed on a second surface 101d of the second layer 101b as in FIG. 8D, similar to the operation 304 in FIGS. 7 and 7D. In operation 405, the semiconductor device 100 is flipped over as in FIG. 8E, similar to the operation 305 in FIGS. 7 and 7E.

Figure 8F:
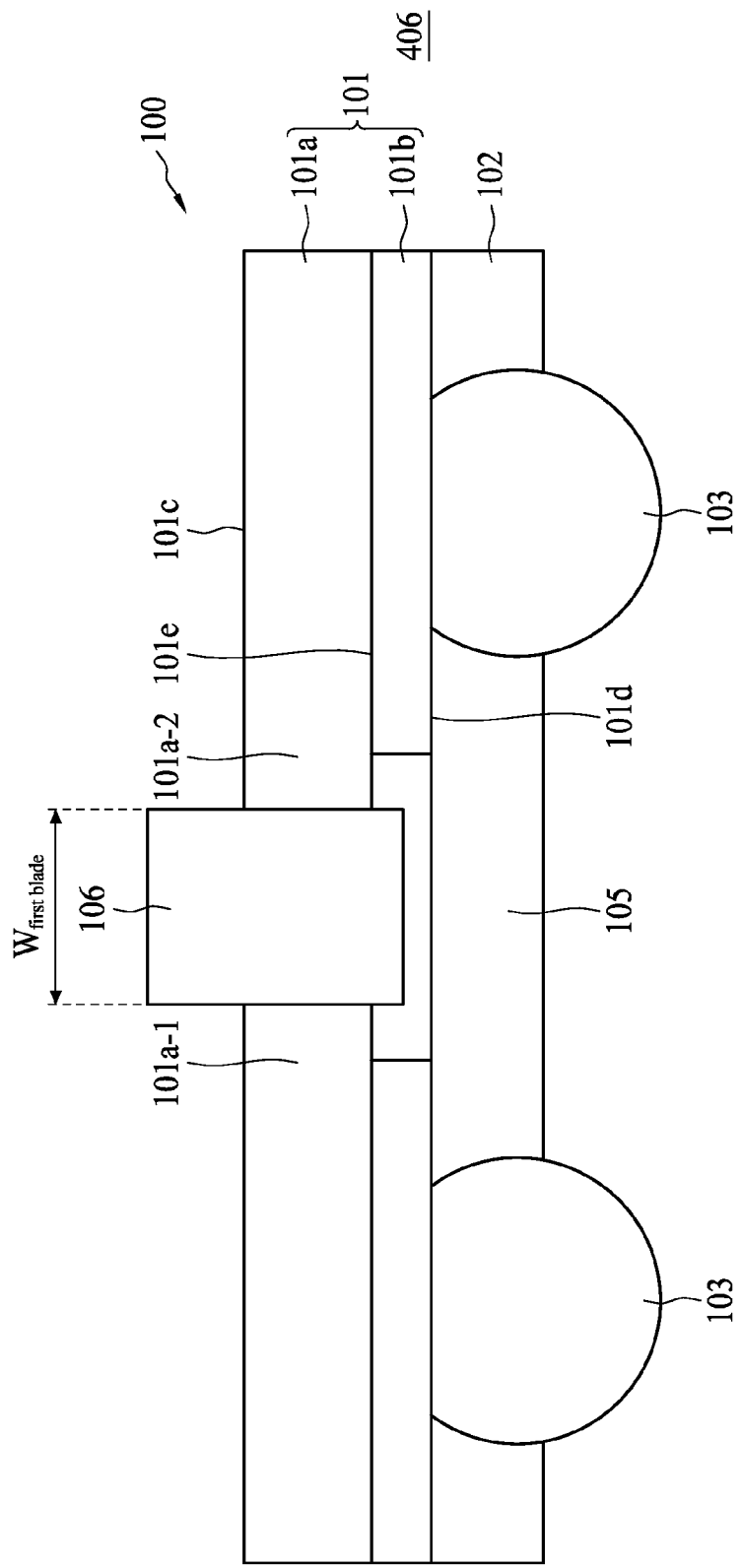
FIG. 8F is a schematic view of a semiconductor device cut by a first blade in accordance with some embodiments of the present disclosure.

In operation 406, the first layer 101a and a portion of the second layer 101b is cut by a first blade 106 as in FIG. 8F. In some embodiments, the first layer 101a and the portion of the second layer 101b are cut above a position 105. The position 105 is between at least two of the solder bumps 103. The first blade 106 passes through the first layer 101a and the portion of the second layer 101b. The first blade 106 is stopped at a position above the second surface 101d. As such, the first layer 101a is completely split into two portions (101a-1, 101a-2) while the second layer 101b is only partially divided after cutting by the first blade 106. In some embodiments, the first blade 106 is a circular saw and has a diameter as the width $W_{first\ blade}$ of the first blade 106.

Figure 8G:
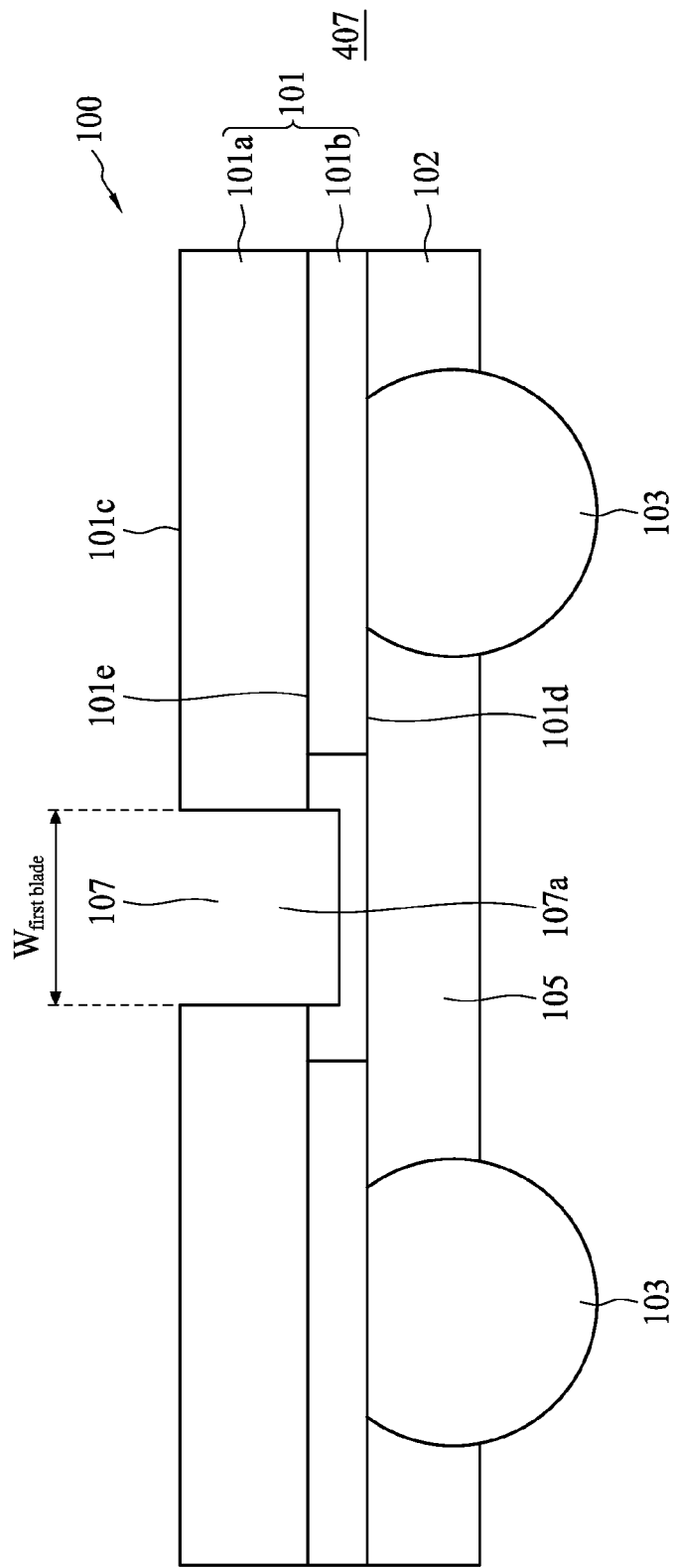
FIG. 8G is a schematic view of a semiconductor device with a first recess in accordance with some embodiments of the present disclosure.

In operation 407, a first recess 107 is formed in the first layer 101a and the portion of the second layer 101b above the position 105 as in FIG. 8G. The first recess 107 is above the position 105 between at least two of the solder bumps 103. The first blade 106 (refers to FIG. 8F) cuts through the first layer 101a and the portion of the second layer 101b to form the first recess 107, so that a bottom surface 107a of the first recess 107 is disposed within the second layer 101b. In some embodiments, the first recess 107 extends from the first surface 101c to the bottom surface 107a of the first recess 107. In some embodiments, the first recess 107 has a width which is substantially the same as the width $W_{first\ blade}$ of the first blade 106.

Figure 8H:
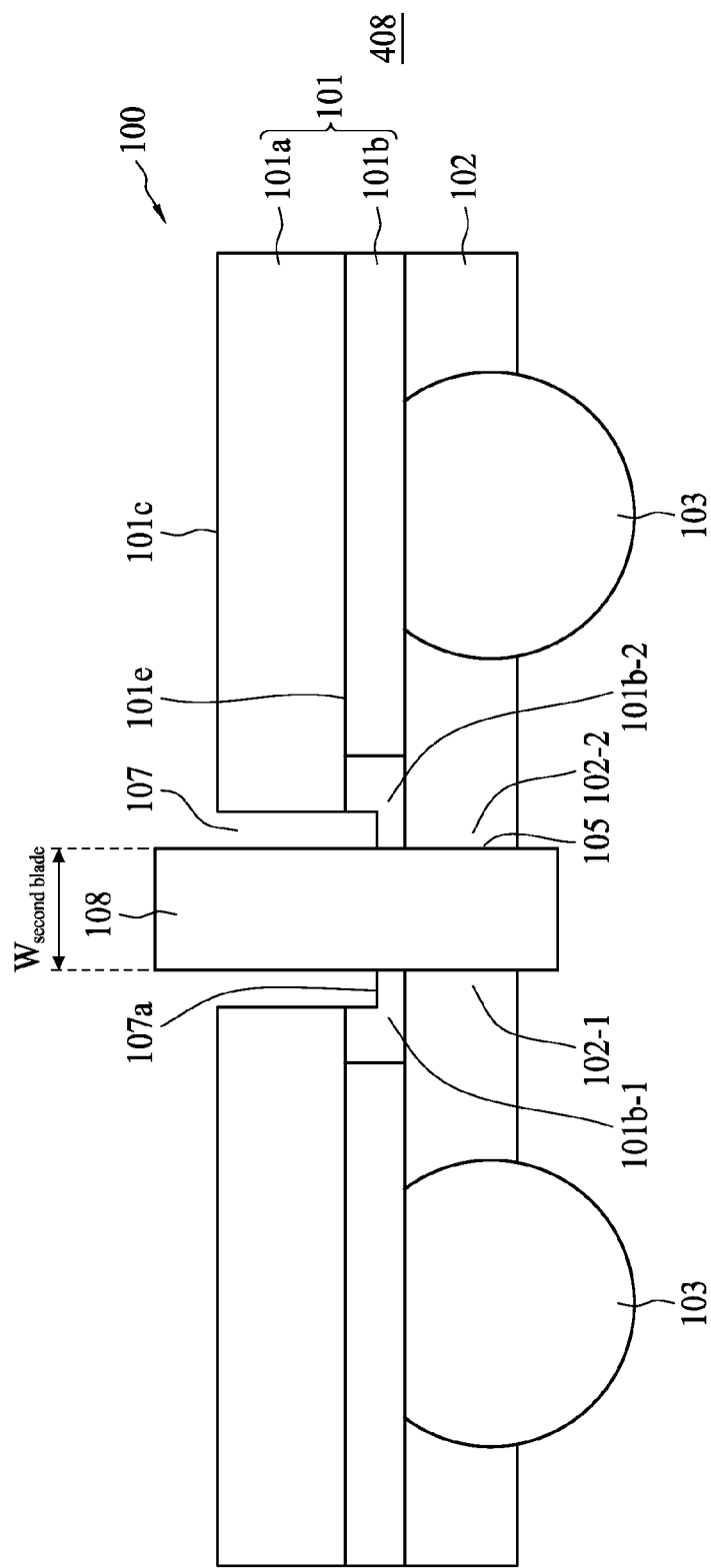
FIG. 8H is a schematic view of a semiconductor device cut by a second blade in accordance with some embodiments of the present disclosure.

In operation 408, the molding 102 and another portion of the second layer 101b is cut from the bottom surface 107a of the first recess 107 by a second blade 108 as in FIG. 8H. In some embodiments, the first blade 106 (refers to FIG. 8F) is changed to the second blade 108. The second blade 108 is used to cut another portion of the second layer 101b above the position 105 and the molding 102 between at least two of the solder bumps 103. The second blade 108 is moved downward from the bottom surface 107a towards the bottom of the semiconductor device 100, so as to completely split the second layer 101b into two portions (101b-1, 101b-2) and split the molding 102 into two portions (102-1, 102-2). In some embodiments, the second blade 108 is a circular saw and has a diameter as the width $W_{second\ blade}$ of the second blade 108. In some embodiments, the width $W_{second\ blade}$ of the second blade 108 is smaller than the width $W_{first\ blade}$ of the first blade 106 (refers to FIG. 8F).

Figure 8I:
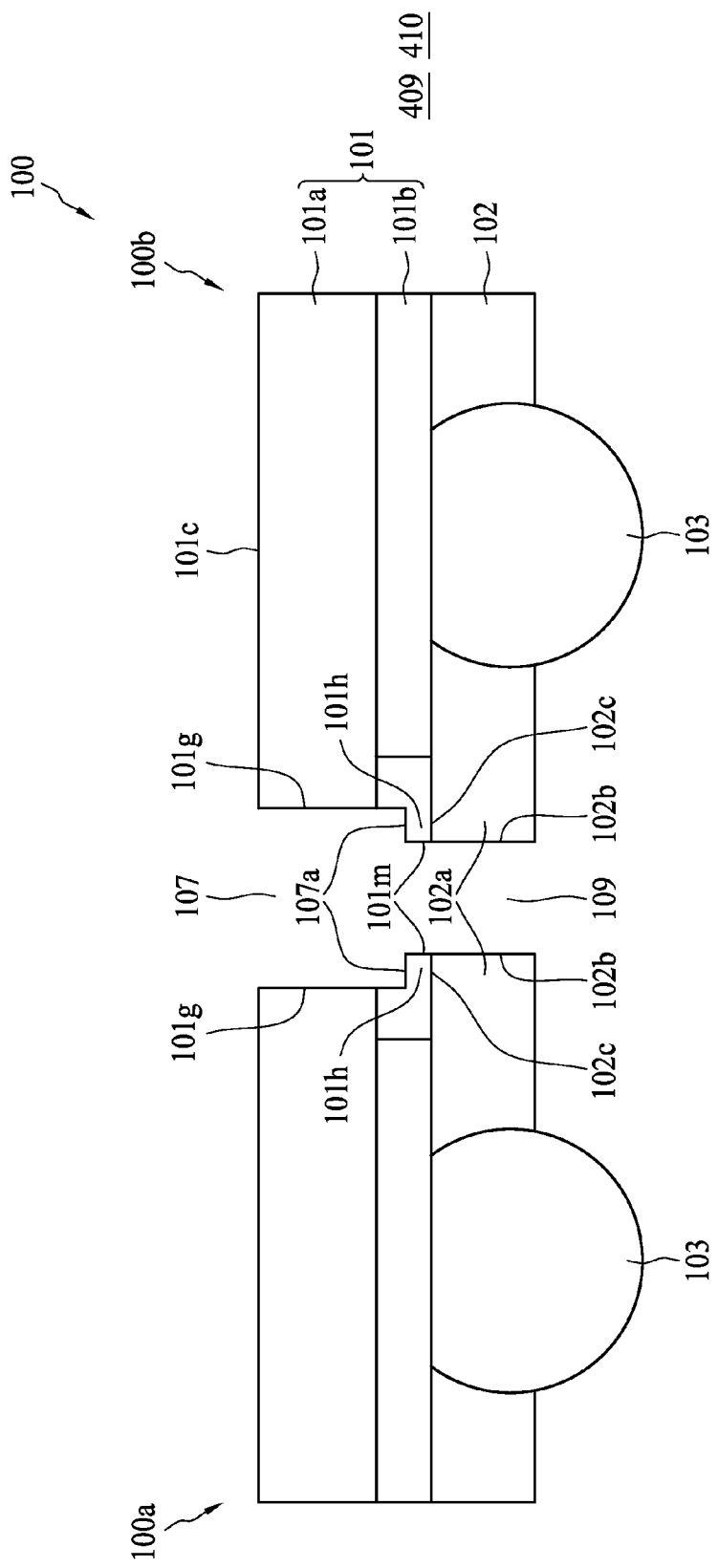
FIG. 8I is a schematic view of a semiconductor device with a first recess and a second recess in accordance with some embodiments of the present disclosure.

In operation 409, a second recess 109 is formed in the another portion of the second layer 101b and in the molding 102 between at least two of the solder bumps 103 as in FIG. 8I. The second blade 108 cuts the molding 102 and the another portion of the second layer 101b to form the second recess 109. In some embodiments, the second recess 109 has a width which is substantially the same as the width $W_{second\ blade}$ of the second blade 108. In some embodiments, the second recess 109 extends from the bottom surface 107a of the first recess 107 to the bottom of the semiconductor device 100. The first recess 107 is located above the second recess 109.

In operation 410, the semiconductor device 100a and the semiconductor device 100b are singulated as in FIG. 8I. They are individualized after cutting of the first layer 101a and the second layer 101b by the first blade 106 (refers to FIG. 8F) and cutting of the molding 102 and the another portion of the second layer 101b by the second blade 108 (refers to FIG. 8H). In some embodiments, the first recess 107 and the second recess 109 are in a stepped configuration, so that the second layer 101b and the molding 102 respectively have a protruded portion 101h and a protruded portion 102a protruding from a sidewall 101g of the first recess 107. The semiconductor device 100a and the semiconductor device 100b respectively have a stepped sidewall. The stepped sidewall includes a sidewall 102b of the molding 102, a sidewall 101m of the second layer 101b and the sidewall 101g of the first layer 101a and the second layer 102.

Figure 9:
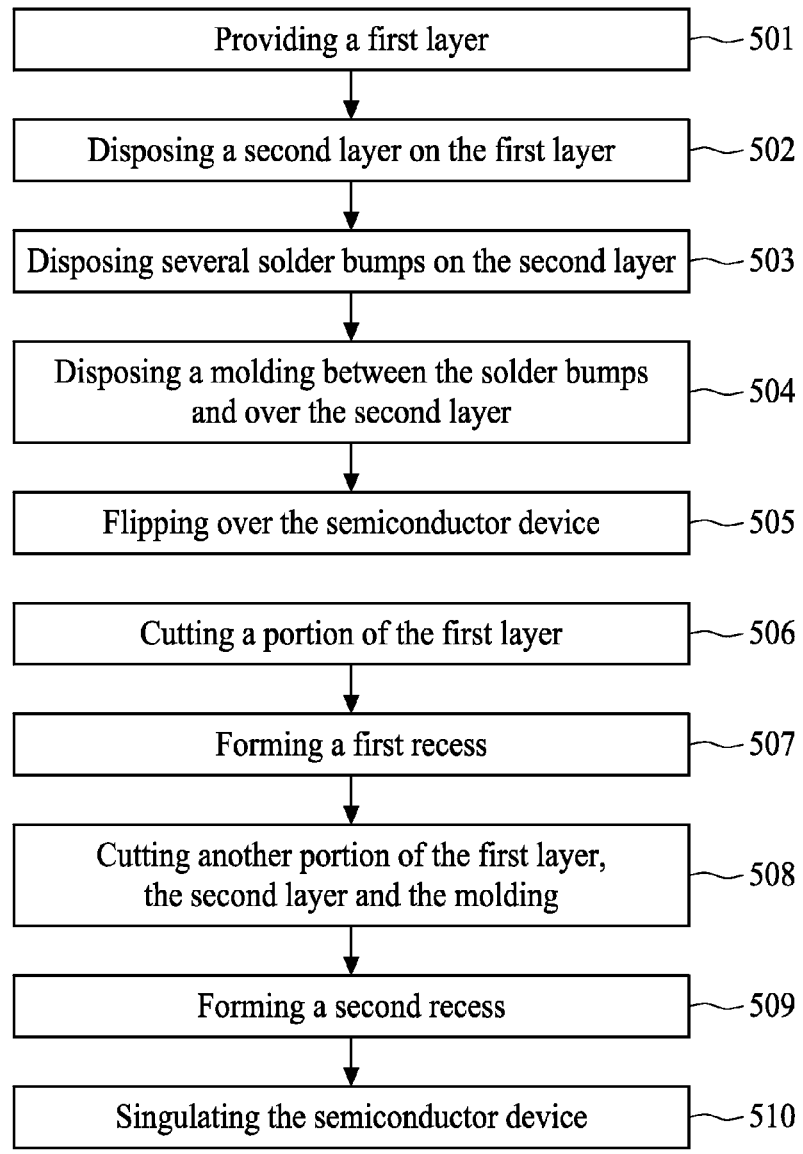
FIG. 9 is a flow diagram of a method of manufacturing a semiconductor device in accordance with some embodiments of the present disclosure.

FIG. 9 is an embodiment of a method 500 of manufacturing a semiconductor device. The method 500 includes a number of operations (501, 502, 503, 504, 505, 506, 507, 508, 509, 510).

Figure 9A:
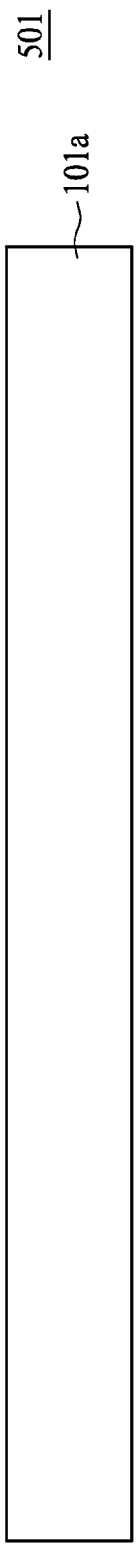
FIG. 9A is a schematic view of a first layer in accordance with some embodiments of the present disclosure.
Figure 9B:
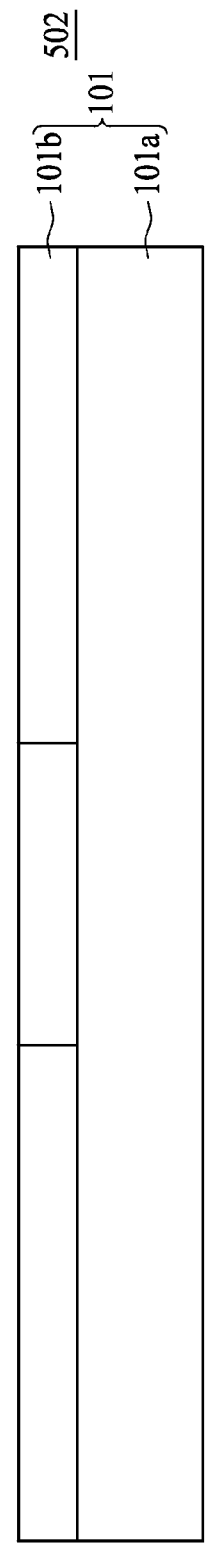
FIG. 9B is a schematic view of a first layer and a second layer in accordance with some embodiments of the present disclosure.
Figure 9C:
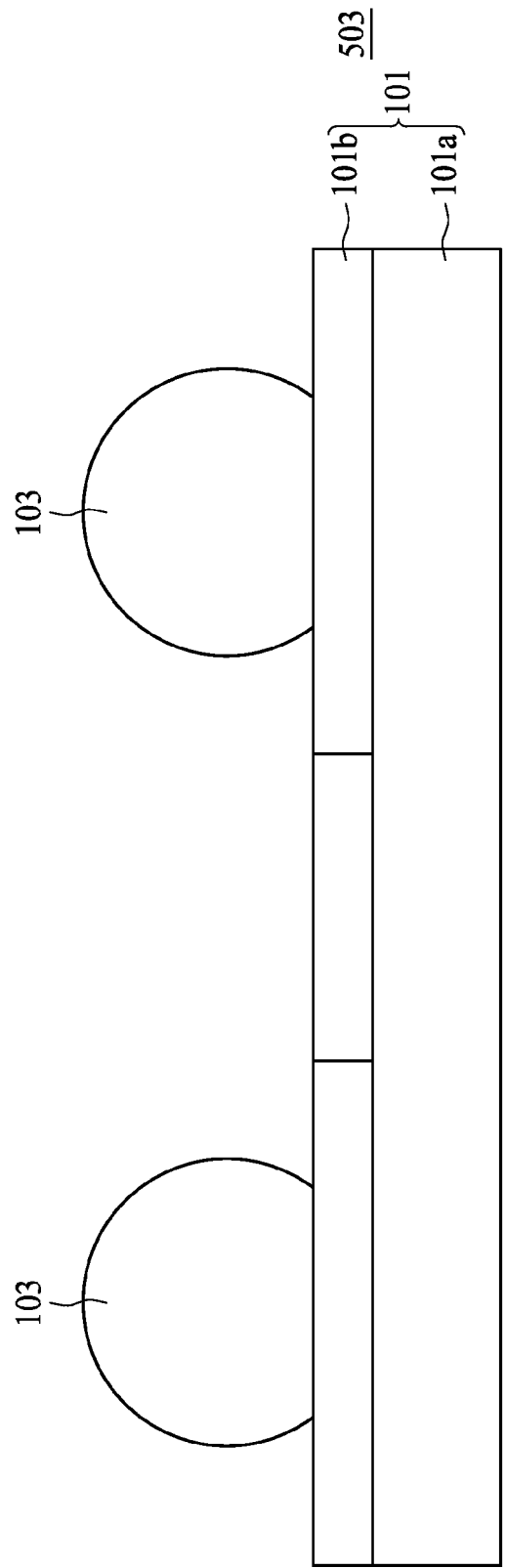
FIG. 9C is a schematic view of several solder bumps on a second layer in accordance with some embodiments of the present disclosure.
Figure 9D:
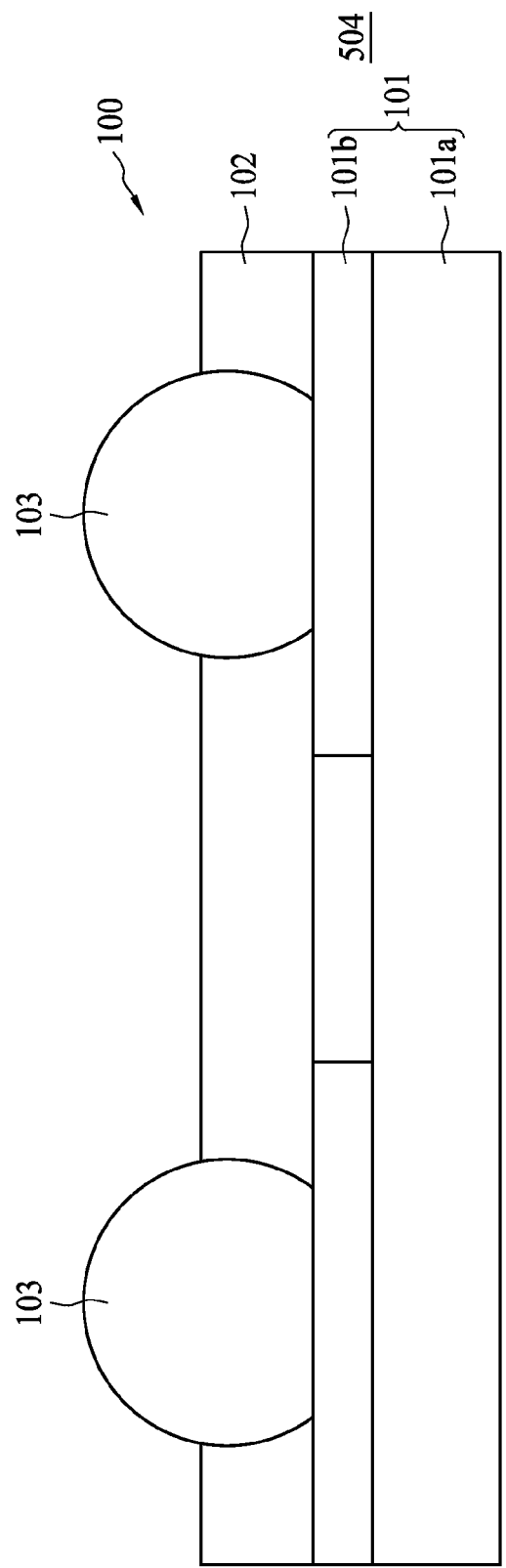
FIG. 9D is a schematic view of a molding on a second layer in accordance with some embodiments of the present disclosure.
Figure 9E:
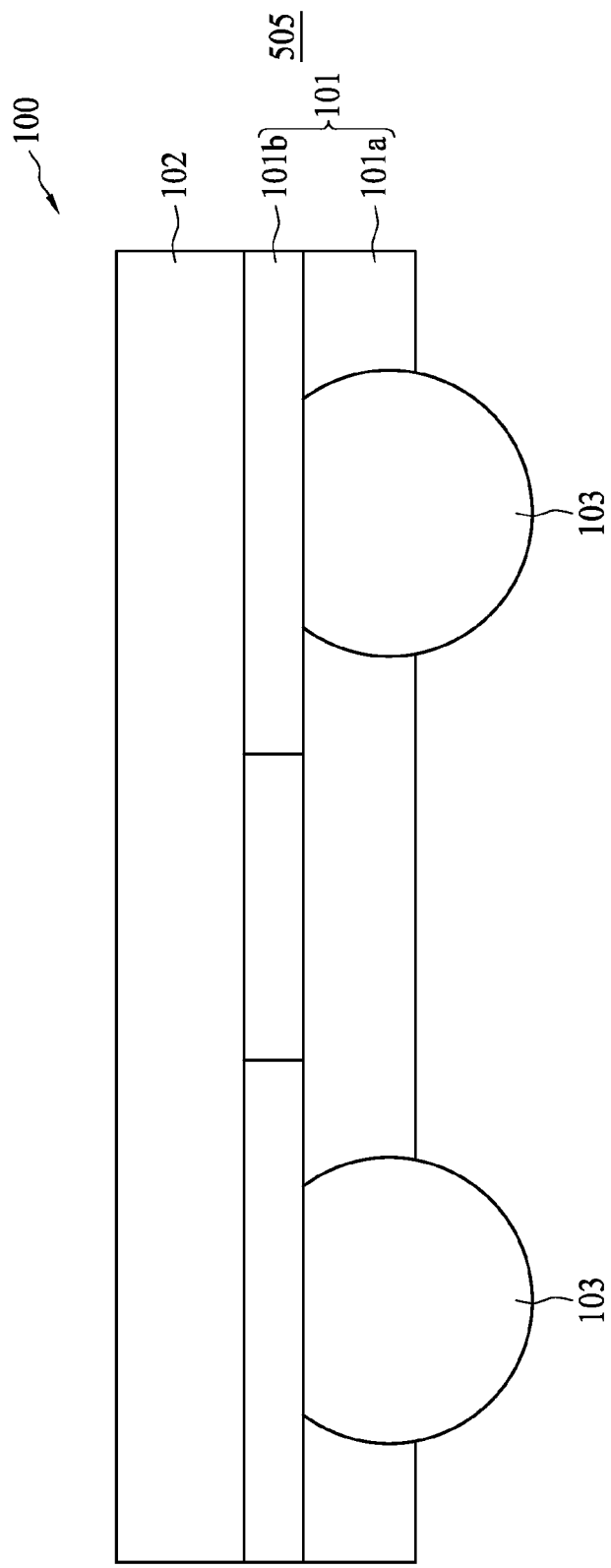
FIG. 9E is a schematic view of several solder bumps facing downward in accordance with some embodiments of the present disclosure.

In operation 501, a first layer 101a is provided as in FIG. 9A, similar to the operation 301 in FIGS. 7 and 7A. In operation 502, a second layer 101b is disposed on the first layer 101a as in FIG. 9B, similar to the operation 302 in FIGS. 7 and 7B. In operation 503, several solder bumps 103 are disposed on the second layer 101b as in FIG. 9C, similar to the operation 303 in FIGS. 7 and 7C. In operation 504, a molding 102 is disposed on a second surface 101d of the second layer 101b as in FIG. 9D, similar to the operation 304 in FIGS. 7 and 7D. In operation 505, the semiconductor device 100 is flipped over as in FIG. 9E, similar to the operation 305 in FIGS. 7 and 7E.

Figure 9F:
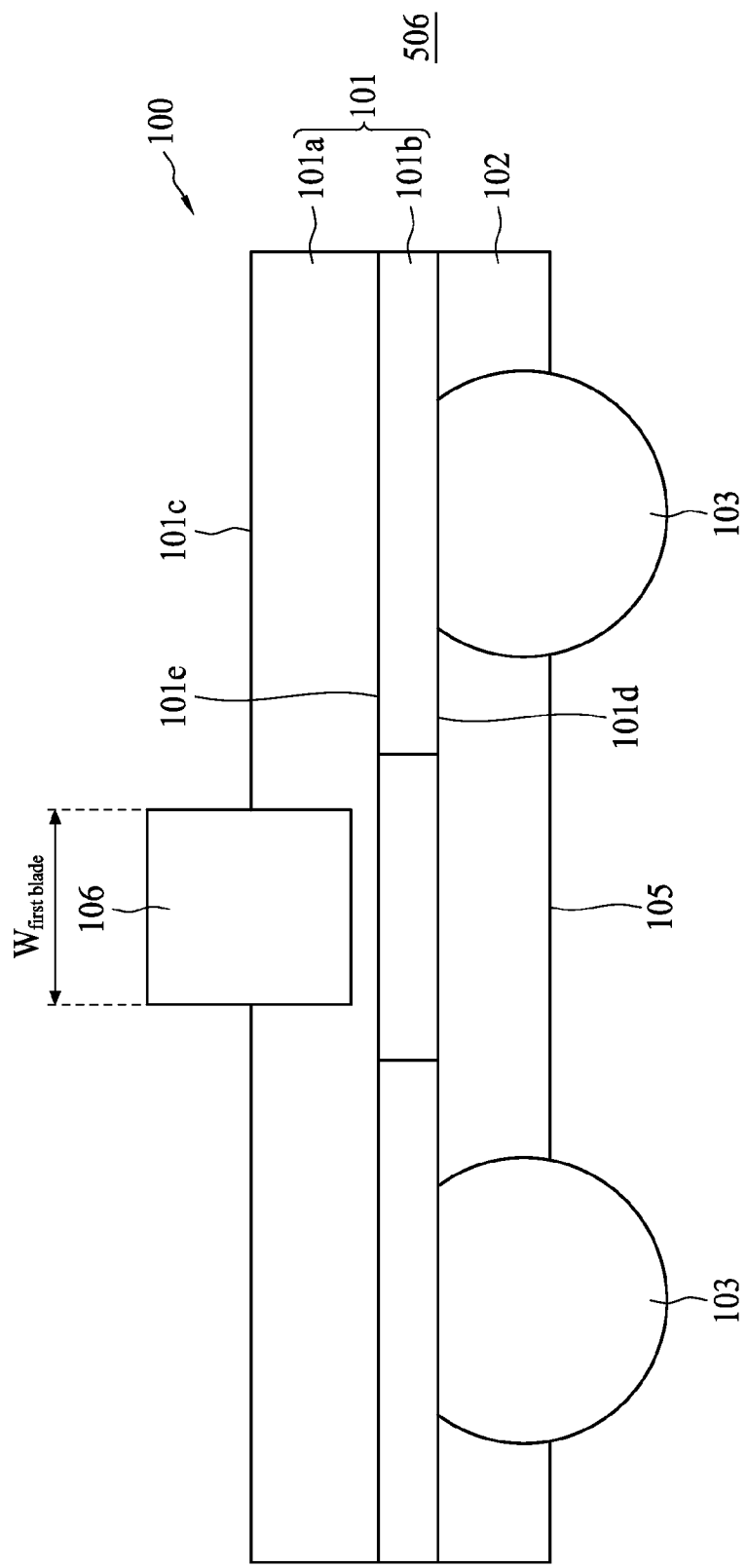
FIG. 9F is a schematic view of a semiconductor device cut by a first blade in accordance with some embodiments of the present disclosure.

In operation 506, a portion of the first layer 101a is cut by a first blade 106 as in FIG. 9F. In some embodiments, the portion of the first layer 101a is cut above a position 105. The position 105 is between at least two of the solder bumps 103. The first blade 106 cuts the portion of the first layer 101a and stops at a position above an interface 101e between the first layer 101a and the second layer 101b. As such, the first layer 101a is only partially divided after cutting by the first blade 106. In some embodiments, the first blade 106 is a circular saw and has a diameter as the width $W_{first\ blade}$ of the first blade 106.

Figure 9G:
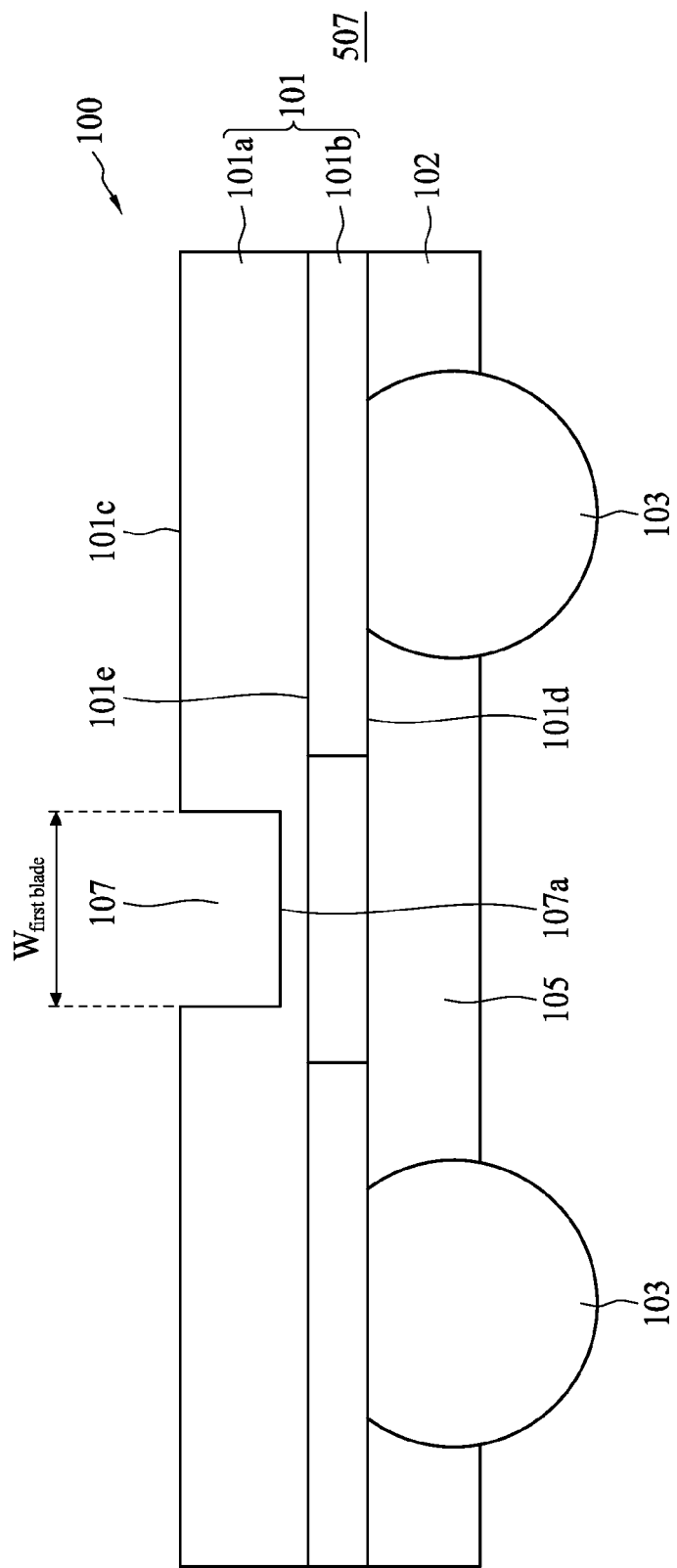
FIG. 9G is a schematic view of a semiconductor device with a first recess in accordance with some embodiments of the present disclosure.

In operation 507, a first recess 107 is formed in the portion of the first layer 101a above the position 105 as in FIG. 9G. The first blade 106 (refers to FIG. 9F) cuts through the portion of the first layer 101a to form the first recess 107, so that a bottom surface 107a of the first recess 107 is disposed within the first layer 101a. In some embodiments, the first recess 107 extends from the first surface 101c into the bottom surface 107a of the first recess 107 above the interface 101e. In some embodiments, the first recess 107 has a width which is substantially the same as the width $W_{first\ blade}$ of the first blade 106.

Figure 9H:
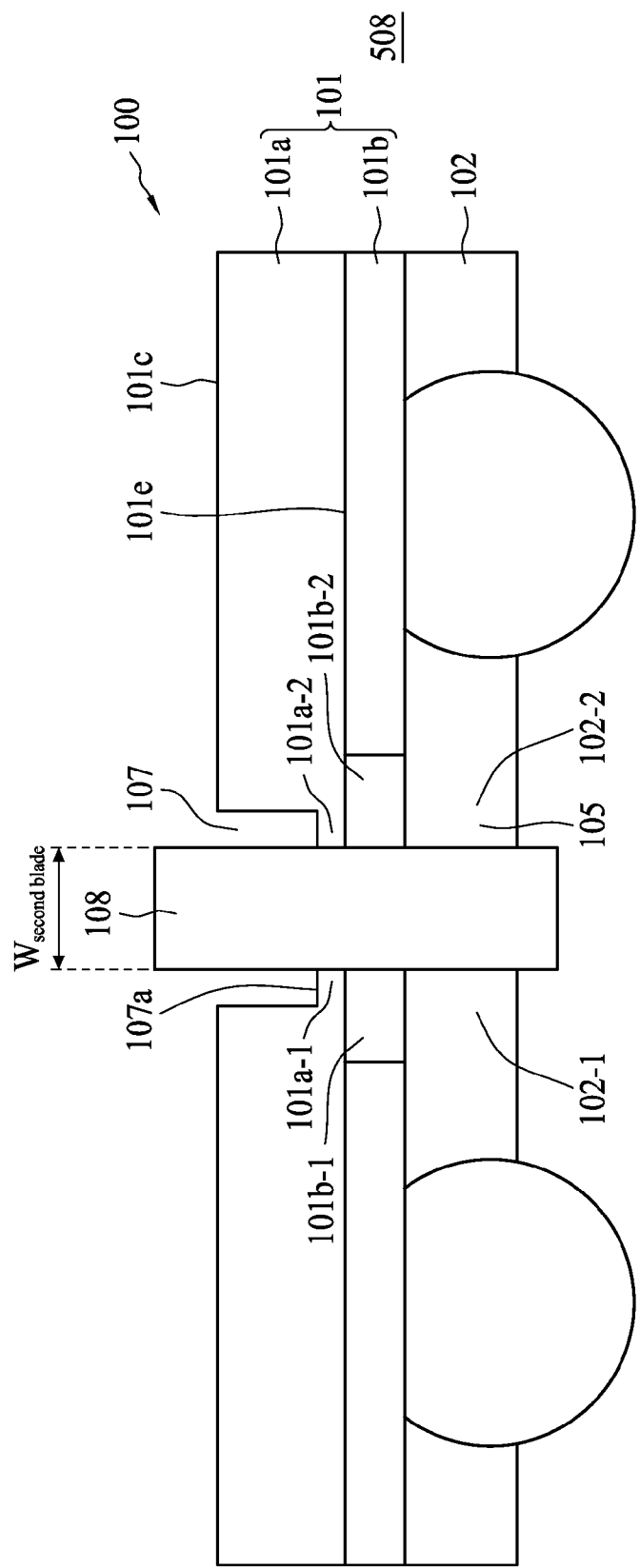
FIG. 9H is a schematic view of a semiconductor device cut by a second blade in accordance with some embodiments of the present disclosure.

In operation 508, another portion of the first layer 101a, the second layer 101b and the molding 102 are cut from the bottom surface 107a of the first recess 107 by a second blade 108 as in FIG. 9H. In some embodiments, the first blade 106 (refers to FIG. 9F) is changed to the second blade 108. The second blade 108 is used to cut the another portion of the first layer 101a and the second layer 101b above the position 105 and the molding 102 between at least two of the solder bumps 103. The second blade 108 is moved downward from the bottom surface 107a towards the bottom of the semiconductor device 100. As such, the first layer 101a is completely split into two portions (101a-1, 101a-2), and the second layer 101b is completely split into two portions (101b-1, 101b-2), and the molding 102 is completely split into two portions (102-1, 102-2). In some embodiments, the second blade 108 is a circular saw and has a diameter as the width $W_{second\ blade}$ of the second blade 108. In some embodiments, the width $W_{second\ blade}$ of the second blade 108 is smaller than the width $W_{first\ blade}$ of the first blade 106 (refers to FIG. 9F).

Figure 9I:
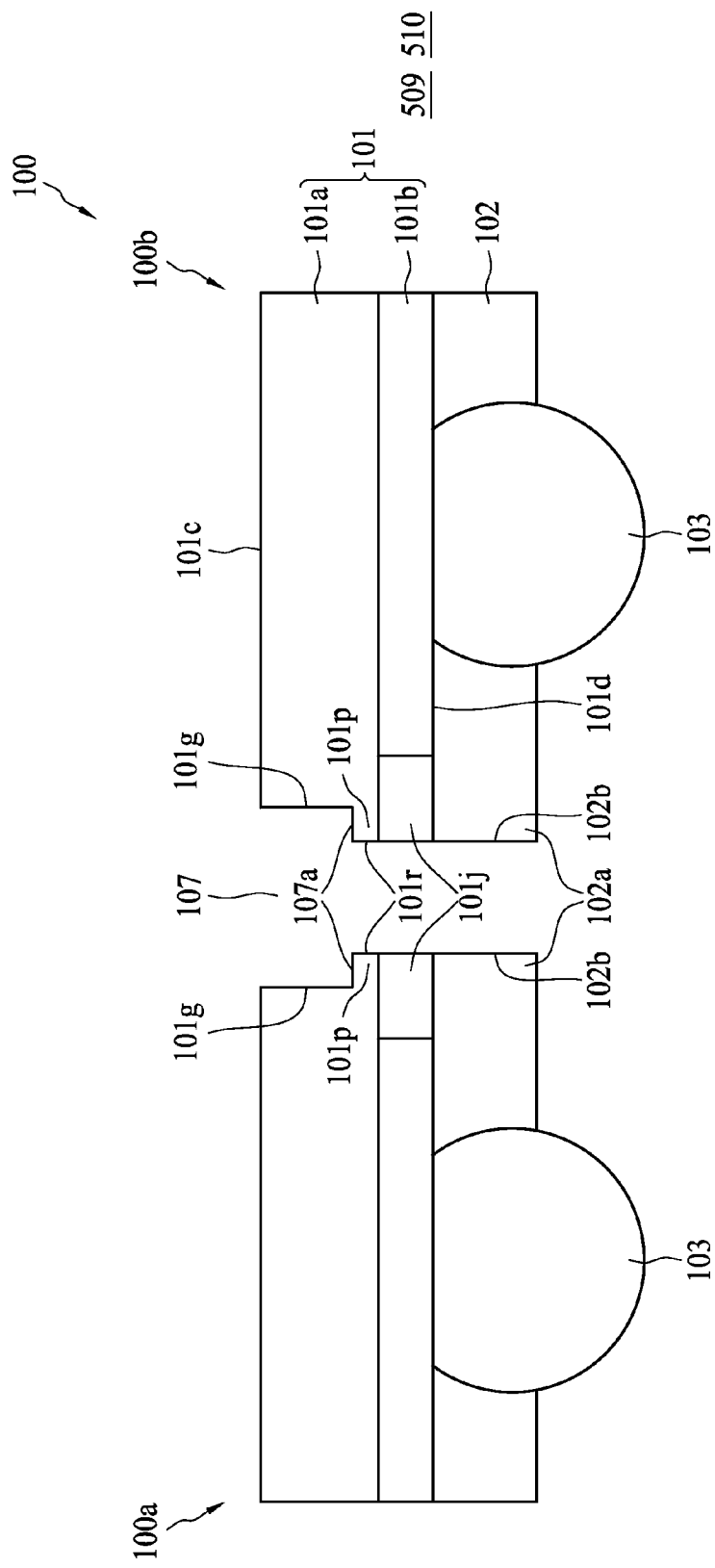
FIG. 9I is a schematic view of a semiconductor device with a first recess and a second recess in accordance with some embodiments of the present disclosure.

In operation 510, the semiconductor device 100a and the semiconductor device 100b are singulated as in FIG. 9I. They are individualized after cutting of the first layer 101a by the first blade 106 (refers to FIG. 9F) and cutting of the another portion of the first layer 101a, the second layer 101b and the molding 102 by the second blade 108 (refers to FIG. 9H). In some embodiments, the first recess 107 and the second recess 109 are in a stepped configuration, so that the first layer 101a, the second layer 101b and the molding 102 respectively have a protruded portion 101p, a protruded portion 101h and a protruded portion 102a. The protruded portion 101p, the protruded portion 101h and the protruded portion 102a are respectively protruded from a sidewall 101g of the first recess 107. The semiconductor device 100a and the semiconductor device 100b respectively have a stepped sidewall. The stepped sidewall includes a sidewall 101r of the first layer 101a, a sidewall 101j of the second layer 101b, a sidewall 102b of the molding and the sidewall 101g of the first layer 101a.

In some embodiments, a method of manufacturing a semiconductor device includes providing a carrier having a first layer, a second layer, a first surface of the first layer and a second surface of the second layer, disposing a plurality of solder bumps on the second surface, disposing a molding between at least two of the plurality of solder bumps and over the second surface, cutting the first layer to form a first recess in the first layer, wherein the first recess is above a position between at least two of the plurality of solder bumps, and cutting the molding from a bottom surface of the first recess to form a second recess in the molding between the at least two of the plurality of solder bumps.

In some embodiments, the method further includes flipping over the semiconductor device prior to the cutting the first layer. In some embodiments, the method further includes changing a first blade to a second blade prior to the cutting the molding. In some embodiments, the first recess is located above the second recess. In some embodiments, the cutting the first layer is implemented by a first blade, and the cutting the molding material is implemented by a second blade. In some embodiments, a width of the second blade is smaller than a width of the first blade. In some embodiments, the first blade and the second blade are respectively a mechanical saw.

In some embodiments, the method further includes cutting the second layer to form the first recess in the second layer above the position between the at least two of the plurality of solder bumps prior to the cutting the molding material. In some embodiments, the cutting the second layer is implemented by the first blade. In some embodiments, the method further includes cutting the second layer to form the second recess in the second layer above the position between the at least two of the plurality of solder bumps prior to the cutting the molding material. In some embodiments, the cutting the second layer is implemented by the second blade.

In some embodiments, a method of manufacturing a semiconductor device includes providing a carrier including a plurality of layers and a plurality of solder bumps wherein the plurality of solder bumps are disposed on a bottom surface of the carrier and are surrounded by a molding, forming a first recess in at least one of the plurality of layers, wherein the first recess is above a position between at least two of the plurality of solder bumps, forming a second recess extending from a bottom surface of the first recess into the molding.

In some embodiments, the plurality of solder bumps are faced downward upon the forming the first recess or the forming the second recess. In some embodiments, the method further includes aligning the semiconductor device with reference to a top surface of the carrier prior to the forming the first recess. In some embodiments, the aligning the semiconductor device is implemented by an infra red inspection.

In some embodiments, a semiconductor device includes a carrier including a first layer and a second layer, a plurality of solder bumps disposed on the second layer, a molding disposed over the second layer and surrounding the plurality of solder bumps; wherein the molding includes a protruded portion protruding from a sidewall of the first layer adjacent to an end portion of the first layer.

In some embodiments, the sidewall of the first layer is aligned with a sidewall of the second layer adjacent to an end portion of the second layer. In some embodiments, the second layer includes a protruded portion protruded from the sidewall of the first layer. In some embodiments, the first layer includes a protruded portion protruded from the sidewall of the first layer. In some embodiments, an end portion of the semiconductor device is in a stepped configuration.

The methods and features of this invention have been sufficiently described in the above examples and descriptions. It should be understood that any modifications or changes without departing from the spirit of the invention are intended to be covered in the protection scope of the invention.

Moreover, the scope of the present application in not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein maybe utilized according to the present disclosure.

Accordingly, the appended claims are intended to include within their scope such as processes, machines, manufacture, compositions of matter, means, methods or steps. In addition, each claim constitutes a separate embodiment, and the combination of various claims and embodiments are within the scope of the invention.

What is claimed is:

1. A method of manufacturing a semiconductor device, comprising:
   providing a carrier including a substrate layer, a second layer, a first surface of the substrate layer and a second surface of the second layer;
   disposing a plurality of solder bumps on the second surface;
   disposing a molding on the second surface and between the plurality of solder bumps;
   cutting the substrate layer from the first surface to form a first recess in the substrate layer, wherein the first recess is above a position between at least two of the plurality of solder bumps; and
   cutting the molding from a bottom surface of the first recess to form a second recess in the molding between the at least two of the plurality of solder bumps.

2. The method of claim 1, further comprising flipping over the semiconductor device prior to the cutting the substrate layer.

3. The method of claim 2, wherein the plurality of solder bumps face downward after the flipping.

4. The method of claim 1, further comprising changing a first blade to a second blade prior to the cutting the molding.

5. The method of claim 4, wherein the cutting the substrate layer is implemented by the first blade, and the cutting the molding is implemented by the second blade.

6. The method of claim 4, wherein a width of the second blade is smaller than a width of the first blade.

7. The method of claim 4, wherein the first blade and the second blade are respectively a mechanical saw.

8. The method of claim 1, wherein the first recess is located above the second recess.

9. The method of claim 1, further comprising cutting the second layer to form the first recess in the second layer above the position between the at least two of the plurality of solder bumps prior to the cutting the molding.

10. The method of claim 9, wherein the cutting the second layer is implemented by the first blade.

11. The method of claim 1, further comprising cutting the second layer to form the second recess in the second layer above the position between the at least two of the plurality of solder bumps prior to the cutting the molding.

12. The method of claim 11, wherein the cutting the second layer is implemented by the second blade.

13. The method of claim 1, wherein a width of the second recess is smaller than a width of the first recess.

14. The method of claim 1, wherein the first recess and the second recess are in a stepped configuration.

15. The method of claim 1, wherein the semiconductor device is singulated to be a first semiconductor device and a second semiconductor device after the cutting the molding.

16. The method of claim 1, wherein the cutting the substrate layer includes removing some of the substrate layer disposed at the position.

17. A method of manufacturing a semiconductor device, comprising:
   providing a carrier including a top surface, a bottom surface opposite to the top surface, a plurality of layers and a plurality of solder bumps disposed on the bottom surface of the carrier and surrounded by a molding;

forming a first recess from the top surface into at least one of the plurality of layers, wherein the first recess is above a position between at least two of the plurality of solder bumps;

forming a second recess extending from a bottom surface of the first recess into the molding.

18. The method of claim 17, wherein the plurality of solder bumps are faced downward upon the forming the first recess or the forming the second recess.

19. The method of claim 17, further comprising aligning the semiconductor device with reference to the top surface of the carrier prior to the forming the first recess.

20. The method of claim 19, wherein the aligning the semiconductor device is implemented by an infra red (IR) inspection.

* * * * *